United States Patent
Watanabe et al.

(10) Patent No.: US 11,469,736 B2
(45) Date of Patent: Oct. 11, 2022

(54) ACOUSTIC WAVE DEVICE, FILTER, MULTIPLEXER, RADIO-FREQUENCY FRONT-END CIRCUIT, AND COMMUNICATION DEVICE

(71) Applicant: Murata Manufacturing Co., Ltd., Nagaokakyo (JP)

(72) Inventors: Munehisa Watanabe, Nagaokakyo (JP); Hideki Iwamoto, Nagaokakyo (JP); Harunobu Horikawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 513 days.

(21) Appl. No.: 16/686,348

(22) Filed: Nov. 18, 2019

(65) Prior Publication Data
US 2020/0091892 A1    Mar. 19, 2020

Related U.S. Application Data

(63) Continuation of application No. PCT/JP2018/016646, filed on Apr. 24, 2018.

(30) Foreign Application Priority Data

May 26, 2017    (JP) ................. 2017-104549

(51) Int. Cl.
*H03H 9/145*    (2006.01)
*H03H 9/64*    (2006.01)
(Continued)

(52) U.S. Cl.
CPC ....... *H03H 9/14541* (2013.01); *H01L 41/047* (2013.01); *H03H 9/02559* (2013.01);
(Continued)

(58) Field of Classification Search
CPC .............. H01L 41/047; H03H 9/02228; H03H 9/02559; H03H 9/02574; H03H 9/0274;
(Continued)

(56) References Cited

U.S. PATENT DOCUMENTS

2013/0285768 A1    10/2013   Watanabe et al.
2015/0270826 A1*   9/2015    Burak ................ H03H 9/14558
                                                        333/187
(Continued)

FOREIGN PATENT DOCUMENTS

JP    08-265091 A    10/1996
JP    2004-096796 A    3/2004
(Continued)

OTHER PUBLICATIONS

Official Communication issued in International Patent Application No. PCT/JP2018/016646, dated Jun. 12, 2018.

*Primary Examiner* — Tan H Trinh
(74) *Attorney, Agent, or Firm* — Keating & Bennett, LLP

(57) ABSTRACT

In an acoustic wave device, a piezoelectric body is directly or indirectly provided on a high acoustic velocity material layer, an interdigital transducer electrode is directly or indirectly provided on the piezoelectric body, the interdigital transducer electrode includes a first busbar, a second busbar spaced away from the first busbar, a plurality of first electrode fingers, and a plurality of second electrode fingers, and a weighting is applied to the interdigital transducer electrode by providing a floating electrode finger not electrically connected to the first busbar or the second busbar or applied by providing an electrode finger formed by metallizing a gap between the first electrode fingers or a gap between the second electrode fingers to integrate the first electrode fingers or the second electrode fingers.

18 Claims, 20 Drawing Sheets

(51) Int. Cl.
*H03H 9/72* (2006.01)
*H03H 9/02* (2006.01)
*H01L 41/047* (2006.01)
*H04B 1/00* (2006.01)

(52) U.S. Cl.
CPC ...... *H03H 9/02992* (2013.01); *H03H 9/6483* (2013.01); *H03H 9/725* (2013.01); *H04B 1/0057* (2013.01)

(58) Field of Classification Search
CPC ........... H03H 9/02992; H03H 9/14526; H03H 9/14541; H03H 9/1457; H03H 9/175; H03H 9/6436; H03H 9/6456; H03H 9/6483; H03H 9/725; H04B 1/0057; H04B 1/006
USPC ........................................................ 333/187
See application file for complete search history.

(56) References Cited

U.S. PATENT DOCUMENTS

| | | | |
|---|---|---|---|
| 2018/0097508 A1 | 4/2018 | Iwamoto et al. | |
| 2018/0152170 A1 | 5/2018 | Iwamoto | |
| 2019/0393854 A1* | 12/2019 | Koyanagi | H03H 9/02574 |
| 2019/0393857 A1* | 12/2019 | Iwamoto | H03H 9/02834 |
| 2020/0052675 A1* | 2/2020 | Kanazawa | H03H 9/72 |

FOREIGN PATENT DOCUMENTS

| | | |
|---|---|---|
| JP | 2015-119450 A | 6/2015 |
| JP | 2016-192696 A | 11/2016 |
| WO | 2012/086639 A1 | 6/2012 |
| WO | 2016/208446 A1 | 12/2016 |
| WO | 2017/043394 A1 | 3/2017 |

* cited by examiner

ACOUSTIC WAVE DEVICE, FILTER, MULTIPLEXER, RADIO-FREQUENCY FRONT-END CIRCUIT, AND COMMUNICATION DEVICE

CROSS REFERENCE TO RELATED APPLICATIONS

This application claims the benefit of priority to Japanese Patent Application No. 2017-104549 filed on May 26, 2017 and is a Continuation Application of PCT Application No. PCT/JP2018/016646 filed on Apr. 24, 2018. The entire contents of each application are hereby incorporated herein by reference.

BACKGROUND OF THE INVENTION

1. Field of the Invention

The present invention relates to an acoustic wave device including a structure with a piezoelectric body directly or indirectly laminated on a high acoustic velocity material layer, and a filter, multiplexer, radio-frequency front-end circuit, and communication device, including the acoustic wave device.

2. Description of the Related Art

Hitherto, in acoustic wave devices, the fractional band widths are, for example, adjusted by applying weighting to interdigital transducer electrodes. In a ladder filter described in Japanese Unexamined Patent Application Publication No. 2004-096796, withdrawal weighting is applied in at least one acoustic wave resonator. Thus, the fractional band width of the at least one acoustic wave resonator is adjusted. As a result, the steepness of the filter characteristics of the ladder filter is enhanced.

International Publication No. WO 2012/086639 describes an acoustic wave device in which a piezoelectric body is directly or indirectly laminated on a high acoustic velocity material layer. This document describes a structure that a piezoelectric body is directly laminated on a high acoustic velocity material layer and a structure that a low acoustic velocity material layer is laminated between a piezoelectric body and a high acoustic velocity material layer.

As described in Japanese Unexamined Patent Application Publication No. 2004-096796, various types of weighting are used to adjust the fractional band width of an acoustic wave device.

The inventors of the subject application have discovered for the first time that, in the acoustic wave device having a structure such that a piezoelectric body is directly or indirectly laminated on a high acoustic velocity material layer, described in International Publication No. WO 2012/086639, the degree of concentration of energy on the surface of the piezoelectric body increases and, as a result, the quality factor is improved. However, when weighting for adjusting the fractional band width is applied, the quality factor can be degraded depending on a method of weighting.

SUMMARY OF THE INVENTION

Preferred embodiments of the present invention provide acoustic wave devices, filters, multiplexers, radio-frequency front-end circuits, and communication devices whose quality factor is hardly degraded even when the fractional band width is adjusted.

According to a preferred embodiment of the present invention, an acoustic wave device includes a high acoustic velocity material layer, a piezoelectric body directly or indirectly provided on the high acoustic velocity material layer, and an interdigital transducer electrode directly or indirectly provided on the piezoelectric body. An acoustic velocity of bulk waves that propagate in the high acoustic velocity material layer is higher than an acoustic velocity of acoustic waves that propagate in the piezoelectric body. The interdigital transducer electrode includes a first busbar, a second busbar spaced away from the first busbar, a plurality of first electrode fingers electrically connected to the first busbar, and a plurality of second electrode fingers electrically connected to the second busbar. Weighting is applied to the interdigital transducer electrode. The weighting is applied by providing a floating electrode finger not electrically connected to the first busbar or the second busbar, or applied by providing an electrode finger formed by metallizing a gap between the first electrode fingers or a gap between the second electrode fingers to integrate the first electrode fingers or the second electrode fingers.

According to a preferred embodiment of the present invention, a filter includes a filter device including a plurality of acoustic wave resonators at least one of which is an acoustic wave device provided in accordance with a preferred embodiment of the present invention. Therefore, a filter whose quality factor is hardly degraded can be provided.

According to a preferred embodiment of the present invention, a multiplexer includes an antenna terminal connected to an antenna, and a plurality of band pass filters whose one ends are connected in common to the antenna terminal. At least one of the plurality of band pass filters includes a plurality of acoustic wave resonators. At least one of the plurality of acoustic wave resonators is an acoustic wave device provided in accordance with a preferred embodiment of the present invention.

According to a preferred embodiment of the present invention, a radio-frequency front-end circuit includes an acoustic wave device provided in accordance with the preferred embodiments of the present invention, and a power amplifier.

According to a preferred embodiment of the present invention, a communication device includes a radio-frequency front-end circuit according to a preferred embodiment of the present invention, and an RF signal processing circuit.

With the acoustic wave devices, filters, multiplexers, radio-frequency front-end circuits, and communication devices according to preferred embodiments of the present invention, the acoustic wave devices, filters, multiplexers, radio-frequency front-end circuits, and communication devices each with good resonant characteristics and filter characteristics can be provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
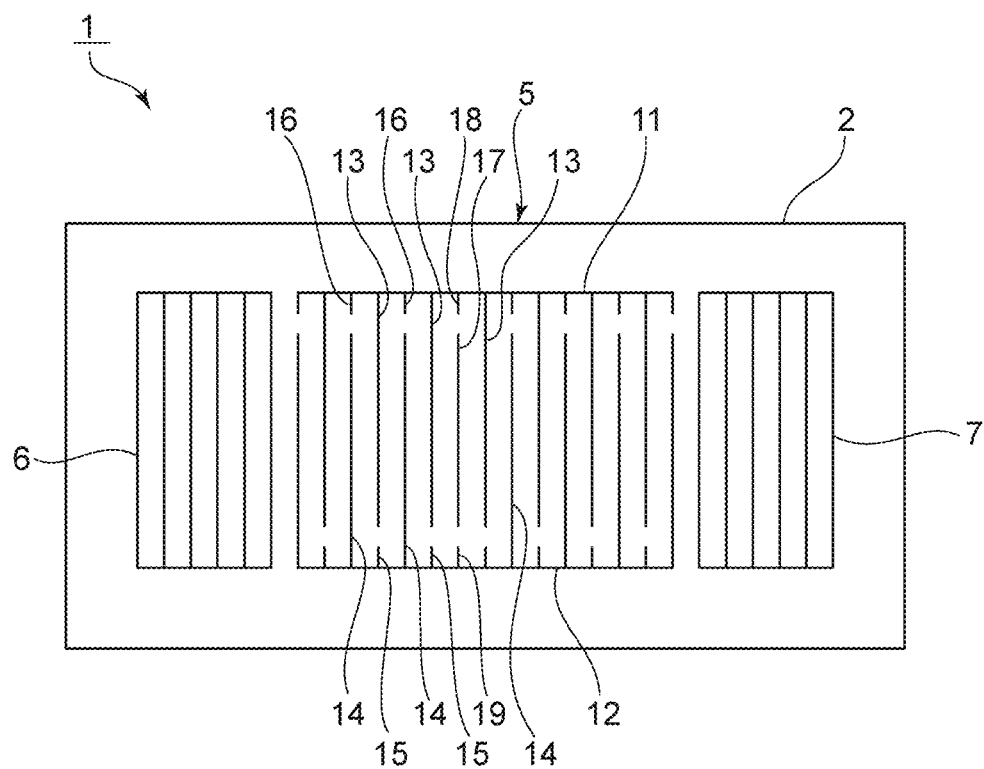
FIG. 1 is a plan view of an acoustic wave device according to a first preferred embodiment of the present invention.

Hereinafter, the present invention will be disclosed by describing specific preferred embodiments of the present invention with reference to the attached drawings.

It is pointed out that the preferred embodiments that will be described in this specification are illustrative and partial replacement or combination of components is possible among the different preferred embodiments.

In an acoustic wave device according to a preferred embodiment of the present invention, preferably, for example, weighting is applied by providing a floating electrode finger. In this case, degradation of the quality factor is significantly reduced, and the electric power handling capability can be significantly improved.

In an acoustic wave device according to a preferred embodiment of the present invention, the acoustic wave device is a series arm resonator of a ladder filter including the series arm resonator and a parallel arm resonator. When the series arm resonator of the ladder filter is adjusted by weighting to narrow the fractional band width, the steepness of the filter characteristics can be significantly improved. Therefore, an acoustic wave device according to a preferred embodiment of the present invention is suitably used as a series arm resonator of a ladder filter.

In an acoustic wave device according to a preferred embodiment of the present invention, the acoustic wave device further includes a low acoustic velocity material layer laminated between a high acoustic velocity material layer and a piezoelectric body, and an acoustic velocity of bulk waves that propagate in the low acoustic velocity material layer is lower than an acoustic velocity of acoustic waves that propagate in the piezoelectric body. In this case, the energy of acoustic waves can be trapped in a portion up to the piezoelectric body.

In an acoustic wave device according to a preferred embodiment of the present invention, the acoustic wave device further includes a support substrate provided on a surface of the high acoustic velocity material layer, opposite from a surface of the high acoustic velocity material layer, on which the low acoustic velocity material layer is provided.

In an acoustic wave device according to a preferred embodiment of the present invention, the high acoustic velocity material layer is a support substrate. In this case, when the high acoustic velocity material layer is used as a support substrate, the mechanical strength of the acoustic wave device can be increased, and simplification of a manufacturing process can also be achieved.

In a filter according to a preferred embodiment of the present invention, the plurality of acoustic wave resonators includes a series arm resonator and a parallel arm resonator, and a ladder filter includes the plurality of acoustic wave resonators.

In a filter according to a preferred embodiment of the present invention, the series arm resonator is an acoustic wave device provided in accordance with a preferred embodiment of the present invention. Therefore, by adjusting the fractional band width to a narrower band width by weighting, the steepness of the filter characteristics can be increased.

In a filter according to a preferred embodiment of the present invention, the filter includes a ladder filter including a plurality of series arm resonators provided in a series arm connecting a first terminal and a second terminal and a parallel arm resonator provided in a parallel arm connecting the series arm and a ground potential, one of the series arm resonators and the parallel arm resonator, closest to the first terminal connected to an antenna terminal, is the series arm resonator, and at least one of the series arm resonators and the parallel arm resonator, other than the series arm resonator closest to the antenna terminal, is an acoustic wave device provided in accordance with a preferred embodiment of the present invention.

In a filter according to a preferred embodiment of the present invention, the filter includes a ladder filter including a plurality of series arm resonators provided in a series arm connecting a first terminal and a second terminal and a parallel arm resonator provided in a parallel arm connecting the series arm and a ground potential, one of the series arm resonators and the parallel arm resonator, closest to the first terminal connected to an antenna terminal, is the parallel arm resonator, and at least one of the series arm resonators and the parallel arm resonator, other than the series arm resonator closest to the first terminal or the parallel arm resonator closest to the antenna terminal, is an acoustic wave device provided in accordance with a preferred embodiment of the present invention.

In a filter according to a preferred embodiment of the present invention, the filter includes a filter device including a longitudinally coupled resonator acoustic wave filter, and the longitudinally coupled resonator acoustic wave filter is an acoustic wave device provided in accordance with a preferred embodiment of the present invention.

In a filter according to a preferred embodiment of the present invention, the filter device further includes a ladder filter connected to the longitudinally coupled resonator acoustic wave filter.

In a filter according to a preferred embodiment of the present invention, the filter includes a first terminal connected to an antenna, and a second terminal, and a longitudinally coupled resonator acoustic wave filter and at least one acoustic wave resonator, connected between the first terminal and the second terminal, at least one of the longitudinally coupled resonator acoustic wave filter and the at least one acoustic wave resonator, other than one of the longitudinally coupled resonator acoustic wave filter and the at least one acoustic wave resonator, closest to the first terminal, is an acoustic wave device provided in accordance with a preferred embodiment of the present invention.

Figure 2:
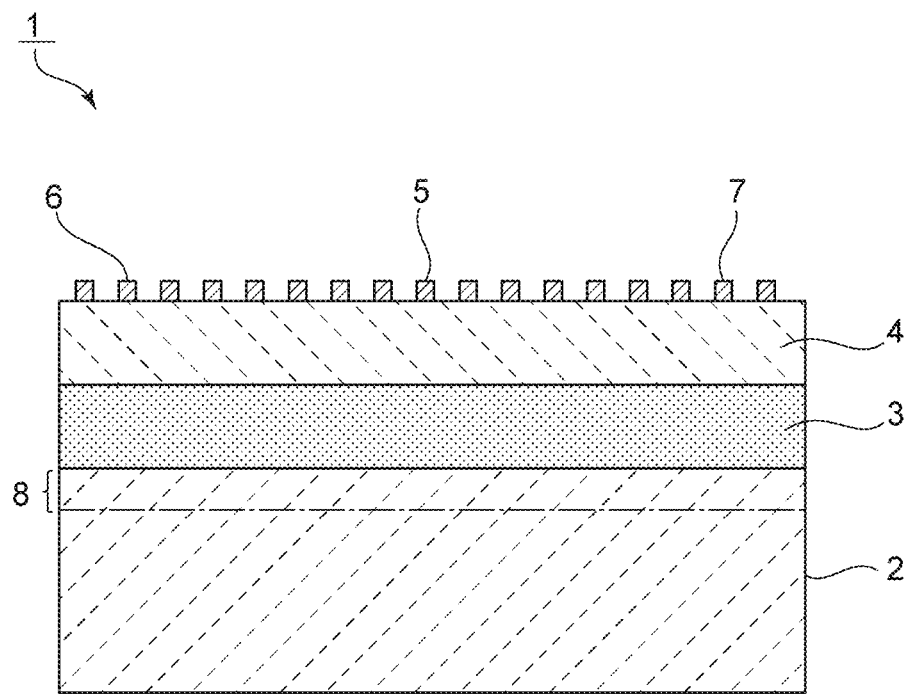
FIG. 2 is a front cross-sectional view of the acoustic wave device of the first preferred embodiment of the present invention.

FIG. 1 is a plan view of an acoustic wave device according to a first preferred embodiment of the present invention. FIG. 2 is a front cross-sectional view.

The acoustic wave device 1 includes a support substrate 2 including a high acoustic velocity material. A low acoustic velocity material layer 3 is laminated on the support substrate 2. A piezoelectric body 4 is laminated on the low acoustic velocity material layer 3. An interdigital transducer electrode 5 and reflectors 6, 7 are provided on the piezoelectric body 4.

The high acoustic velocity material is a material in which bulk waves propagate at a higher acoustic velocity than acoustic waves propagate in the piezoelectric body 4. The low acoustic velocity material layer 3 includes a low acoustic velocity material. The low acoustic velocity material is a material in which bulk waves propagate at a lower acoustic velocity than acoustic waves propagate in the piezoelectric body 4.

Various materials may be used as each of the above-described high acoustic velocity material and low acoustic velocity material as long as the above acoustic velocity relationship is satisfied.

Examples of the high acoustic velocity material include various materials, such as aluminum nitride, aluminum oxide, silicon carbide, silicon nitride, silicon oxynitride, silicon, sapphire, lithium tantalate, lithium niobate, quartz crystal, alumina, zirconia, cordierite, mullite, steatite, forsterite, magnesia, a diamondlike carbon (DLC) film, and diamond, a medium including any one of these materials as a main ingredient, and a medium including a mixture of some of these materials as a main ingredient.

Examples of the low acoustic velocity material include silicon oxide, glass, silicon oxynitride, tantalum oxide, and a medium including any one of these materials, such as a compound obtained by adding fluorine, carbon, or boron to silicon oxide, as a main ingredient.

The piezoelectric body 4 preferably includes lithium tantalate in the first preferred embodiment. The piezoelectric body 4 may be one or more of various piezoelectric materials, for example, lithium niobate, zinc oxide, and tantalum pentoxide.

In the first preferred embodiment, the support substrate 2, the low acoustic velocity material layer 3, and the piezoelectric body 4 are laminated. However, a high acoustic velocity material layer 8 represented by the alternate long and short dashed line in FIG. 2 may be further provided. In other words, the high acoustic velocity material layer 8 may be further laminated between the support substrate 2 and the low acoustic velocity material layer 3. In other words, the support substrate 2 is provided on a surface of the high acoustic velocity material layer 8, opposite from a surface of the high acoustic velocity material layer 8, on which the low acoustic velocity material layer 3 is provided. In this case, the support substrate 2 may include a material other than the high acoustic velocity material. Examples of the material of the support substrate 2 include a piezoelectric body, such as aluminum oxide, diamond, sapphire, lithium tantalate, lithium niobate, and quartz crystal, various ceramics, such as alumina, magnesia, silicon nitride, aluminum nitride, silicon carbide, zirconia, cordierite, mullite, steatite, and forsterite, a dielectric, such as glass, a semiconductor, such as gallium nitride, and a resin substrate.

The interdigital transducer electrode 5 and the reflectors 6, 7 each are made of a metal or alloy. Examples of such a metal include Pt, Au, W, Mo, Cu, Al, and an alloy including any one of these materials as a main ingredient. The interdigital transducer electrode 5 and the reflectors 6, 7 each may be made from a laminated metal film formed by laminating a plurality of metal films.

The interdigital transducer electrode 5 includes a first busbar 11 and a second busbar 12 spaced away from the first busbar 11. One ends of a plurality of first electrode fingers 13 are connected to the first busbar 11. One ends of a plurality of second electrode fingers 14 are connected to the second busbar 12. The plurality of first electrode fingers 13 and the plurality of second electrode fingers 14 interdigitate with each other.

On the other hand, although not indispensable, first dummy electrode fingers 15 and second dummy electrode fingers 16 are provided. The first dummy electrode fingers 15 are provided with a gap from the distal ends of the first electrode fingers 13 and are connected to the second busbar 12. The second dummy electrode fingers 16 are provided with a gap from the distal ends of the second electrode fingers 14 and are connected to the first busbar 11.

The acoustic wave device 1 has a characteristic that the acoustic wave device 1 includes the support substrate 2 made from the high acoustic velocity material layer in which bulk waves propagate at a higher acoustic velocity than acoustic waves propagate in the piezoelectric body 4, the low acoustic velocity material layer 3 directly or indirectly laminated on the support substrate 2, an acoustic velocity of bulk waves that propagate in the low acoustic velocity material layer 3 being lower than an acoustic velocity of acoustic waves that propagate in the piezoelectric body 4, the piezoelectric body 4 directly or indirectly provided on the low acoustic velocity material layer 3, and the interdigital transducer electrode 5 directly or indirectly provided on the piezoelectric body 4, and weighting is applied to the interdigital transducer electrode 5. The weighting is applied by providing a floating electrode finger 17. In other words, the floating electrode finger 17 is provided in a center region in an acoustic wave propagation direction in the interdigital transducer electrode 5. Although not indispensable, third and fourth dummy electrode fingers 18, 19 each are provided to face the floating electrode finger 17 with a gap.

The floating electrode finger 17 is not electrically connected to the first busbar 11 or electrically connected to the second busbar 12.

The number of the floating electrode fingers 17 is not specifically limited and may be one or more.

Because the weighting is applied by providing the floating electrode finger 17, the quality factor is hardly degraded even when the fractional band width is adjusted in the acoustic wave device 1. The inventors of preferred embodiments of the present invention discovered for the first time that, when the fractional band width is adjusted by weighting with a structure that the support substrate 2 including a high acoustic velocity material, the low acoustic velocity material layer 3, and the piezoelectric body 4 are laminated, the quality factor is degraded depending on a method of weighting. As a result of diligent study, the inventors of preferred embodiments of the present invention discovered that, when weighting is applied by providing the floating electrode finger 17 or applied by providing a metallized integrated electrode finger (described later) among types of weighting, the fractional band width can be adjusted without degradation of the quality factor, and have developed preferred embodiments of the present invention. In other words, preferred embodiments of the present invention are based on experimental findings of the inventors of preferred embodiments of the present invention.

The acoustic wave device 1 was manufactured with the following design parameters.

The piezoelectric body 4 included lithium tantalate and had a thickness of about 600 nm. The support substrate 2 included silicon and had a thickness of about 0.12 mm. The low acoustic velocity material layer 3 included silicon oxide and had a thickness of about 673 nm. The wave length determined by the electrode finger pitch of the interdigital transducer electrode 5 was about 2 µm. The electrode finger overlap width was about 40 µm. The number of the first and second electrode fingers 13, 14 was 201. The number of the floating electrode fingers 17 was 20.

Therefore, the percentage of weighting applied by providing the floating electrode finger 17, expressed by (Number of floating electrode fingers 17)/(Number of first and second electrode fingers 13, 14—Number of floating electrode fingers 17×2), was set to about 10%. In other words, where the number of the floating electrode fingers 17 is A and the number of the first and second electrode fingers 13, 14 is B, the percentage of weighting is expressed by A/(B−A×2). The number of the electrode fingers of the reflectors 6, 7 was 21.

Figure 3:
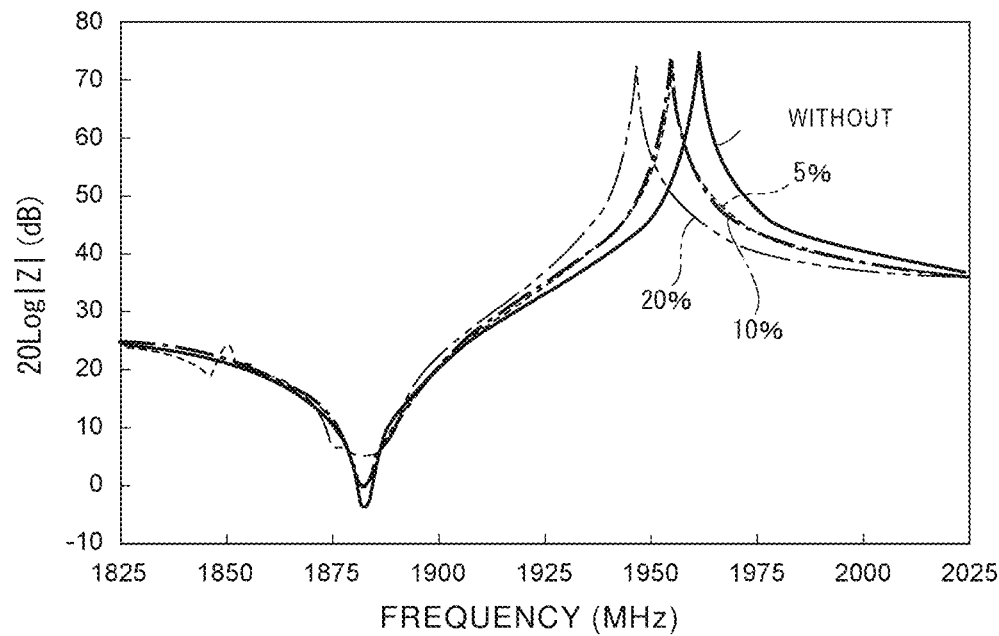
FIG. 3 is a graph that shows the resonant characteristics of Comparative Example 1 in which no floating electrode finger is provided and the resonant characteristics of each of the acoustic wave devices whose percentage of weighting applied by providing a floating electrode finger is about 5%, about 10%, or about 20% in the first preferred embodiment of the present invention.
Figure 4:
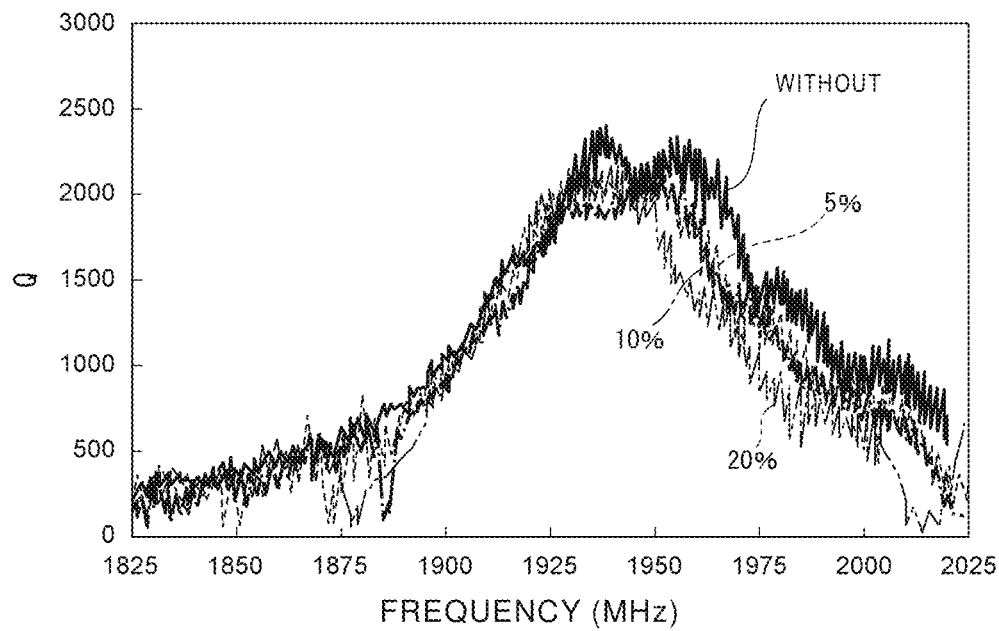
FIG. 4 is a graph that shows the quality factor characteristics of Comparative Example 1 in which no floating electrode finger is provided and the quality factor characteristics of each of the acoustic wave devices whose percentage of weighting applied by providing a floating electrode finger is about 5%, about 10%, or about 20% in the first preferred embodiment of the present invention.

FIG. 3 is a graph that shows the resonant characteristics of an acoustic wave device of Comparative Example 1 configured similarly to the first preferred embodiment except that no floating electrode finger is provided and the resonant characteristics of each of the acoustic wave devices whose percentage of weighting applied by providing the floating electrode finger is about 5%, about 10%, or about 20%. FIG. 4 is a graph that shows the quality factor characteristics of the acoustic wave device of Comparative Example 1 and the quality factor characteristics of each of the acoustic wave devices whose percentage of weighting applied by providing the floating electrode finger is about 5%, about 10%, or about 20%.

As is apparent from FIG. 3, it is clear that, when the plurality of floating electrode fingers 17 is provided, the frequency range between the resonant frequency and the anti-resonant frequency can be narrowed, and the fractional band width can be adjusted to narrow. It is also clear that the fractional band width narrows as the percentage of weighting increases. It is clear from FIG. 3 that the ratio of impedance at the anti-resonant frequency to impedance at the resonant frequency does not degrade even when the percentage of weighting is changed. Therefore, good resonant characteristics can be obtained. In addition, as shown in FIG. 4, when the percentage of weighting applied by providing a floating electrode finger is changed, the quality factor characteristics also do not degrade. The quality factor characteristics are good when the quality factor in the frequency range between the resonant frequency and the anti-resonant frequency is high. Therefore, when the percentage of weighting is about 10% or about 20%, the quality factor is low at higher frequencies than the anti-resonant frequency. However, a sufficiently high quality factor is obtained in the frequency range between the resonant frequency and the anti-resonant frequency. Therefore, it is understood that the acoustic wave device 1 can adjust the fractional band width while maintaining a high quality factor in a good condition.

Figure 5:
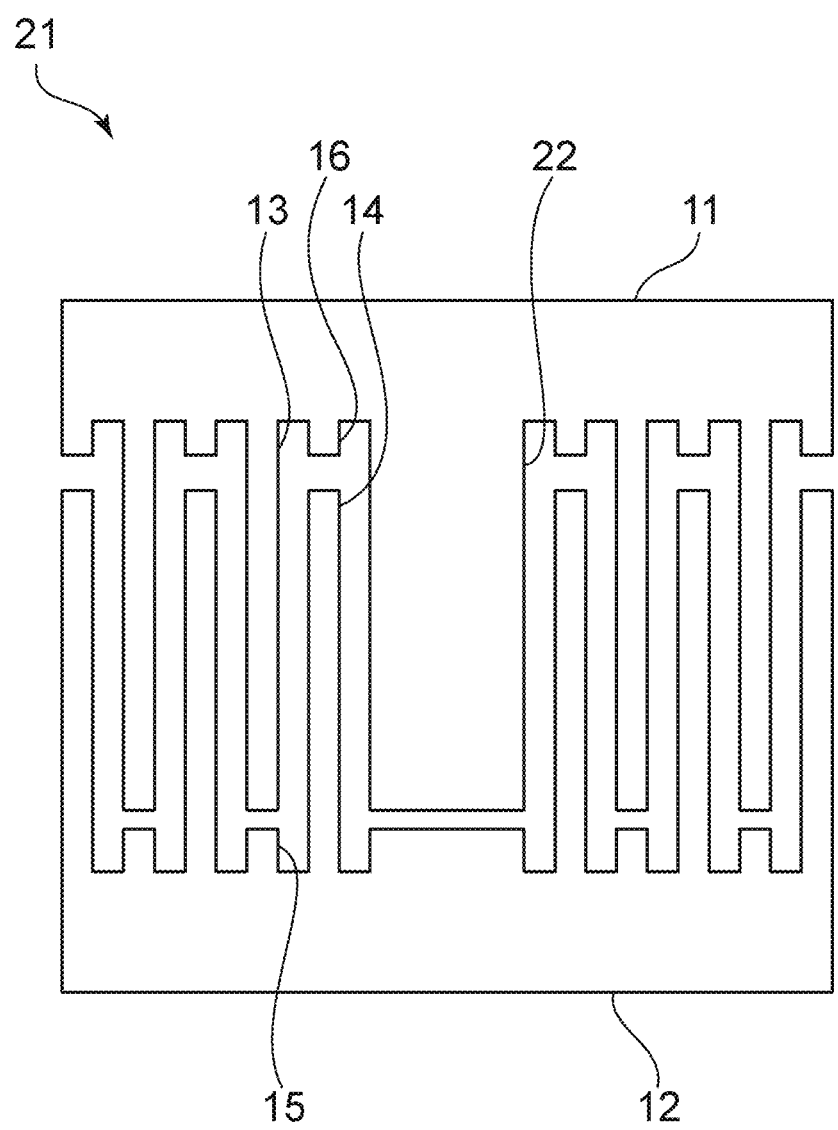
FIG. 5 is a plan view that shows an interdigital transducer electrode of an acoustic wave device according to a second preferred embodiment of the present invention.

FIG. 5 is a plan view that shows an interdigital transducer electrode of an acoustic wave device of a second preferred embodiment of the present invention. In the acoustic wave device of the second preferred embodiment, weighting is applied by providing the interdigital transducer electrode 21 with a metallized integrated electrode finger 22. The other features and elements are similar to that of the acoustic wave device 1 of the first preferred embodiment. The metallized integrated electrode finger 22 is an electrode finger formed by metallizing a gap between first electrode fingers or a gap between second electrode fingers to integrate the first electrode fingers or the second electrode fingers. In other words, between portions where the first electrode finger 13 and the second electrode finger 14 are alternately provided in the acoustic wave propagation direction, a weighted region is provided by interrupting this periodic structure. Therefore, with the interdigital transducer electrode 21 as well, the percentage of weighting can be changed by changing the size of the metallized integrated electrode finger 22 in the width direction. Thus, the fractional band width can be adjusted.

In other words, the acoustic wave device of the second preferred embodiment has a characteristic that the acoustic wave device includes the support substrate 2 made from the high acoustic velocity material layer in which bulk waves propagate at a higher acoustic velocity than acoustic waves propagate in the piezoelectric body 4, the low acoustic velocity material layer 3 directly or indirectly laminated on the support substrate 2, an acoustic velocity of bulk waves that propagate in the low acoustic velocity material layer 3 being lower than an acoustic velocity of acoustic waves that propagate in the piezoelectric body 4, the piezoelectric body 4 directly or indirectly provided on the low acoustic velocity material layer 3, and the interdigital transducer electrode 5 directly or indirectly provided on the piezoelectric body 4, and weighting is applied to the interdigital transducer electrode 5. The weighting is applied by providing the metallized integrated electrode finger 22.

The percentage (%) of weighting applied by providing the metallized integrated electrode finger 22 is calculated from (Number of electrode fingers in metallized integrated electrode finger 22)/(Number of first and second electrode fingers 13, 14).

In other words, where the number of electrode fingers in the metallized integrated electrode finger 22 is A and the number of the first and second electrode fingers 13, 14 is B, the percentage of weighting is A/B.

Figure 6:
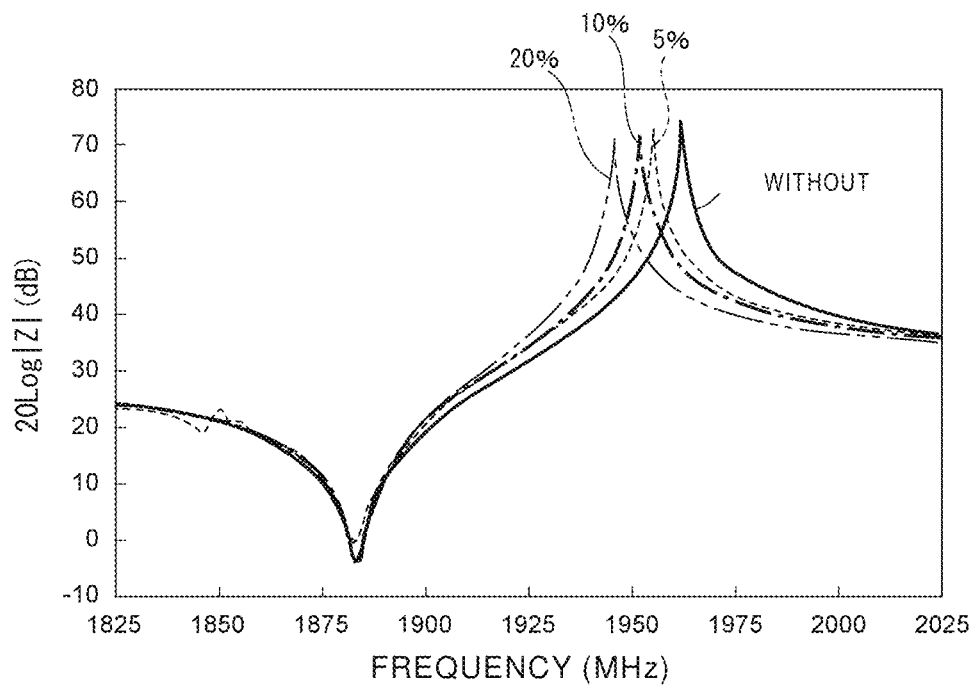
FIG. 6 is a graph that shows the resonant characteristics of Comparative Example 1 in which no weighting is applied and the resonant characteristics of each of the acoustic wave devices whose percentage of weighting applied by providing a metallized integrated electrode finger is about 5%, about 10%, or about 20% in the second preferred embodiment of the present invention.
Figure 7:
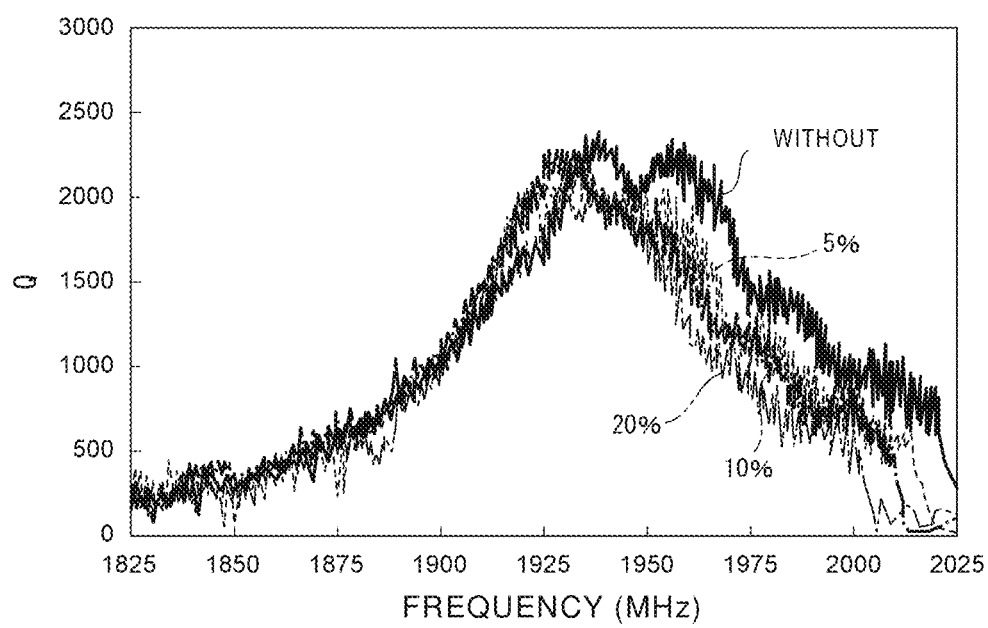
FIG. 7 is a graph that shows the quality factor characteristics of Comparative Example 1 in which no weighting is applied and the quality factor characteristics of each of the acoustic wave devices whose percentage of weighting applied by providing a metallized integrated electrode finger is about 5%, about 10%, or about 20% in the second preferred embodiment of the present invention.

Comparative Example 1 is the acoustic wave device to which no weighting is applied. FIG. 6 is a graph that shows the resonant characteristics of the acoustic wave device of Comparative Example 1 and the resonant characteristics of each of the acoustic wave devices whose percentage of weighting applied by providing the metallized integrated electrode finger 22 is about 5%, about 10%, or about 20% in the second preferred embodiment. FIG. 7 is a graph that shows the quality factor characteristics of the acoustic wave device of Comparative Example 1 and the quality factor characteristics of each of the acoustic wave devices whose percentage of weighting applied by providing the metallized integrated electrode finger 22 is about 5%, about 10%, or about 20%.

As is apparent from FIG. 6, in the second preferred embodiment as well, the fractional band width can be adjusted by changing the percentage of weighting among about 5%, about 10%, or about 20%. In the second preferred embodiment as well, a fractional band width can be adjusted in a direction to narrow by increasing the percentage of weighting. From FIG. 6, in the second preferred embodiment as well, even when the fractional band width is adjusted, the impedance ratio almost does not decrease. Therefore, good resonant characteristics can be obtained.

As shown in FIG. 7, in the second preferred embodiment as well, even when weighting is applied by providing the metallized integrated electrode finger 22 as described above, the quality factor almost does not degrade.

Thus, the fractional band width can be adjusted while good quality factor characteristics are maintained.

The metallized integrated electrode finger 22 is not excited unlike the first and second electrode fingers 13, 14, so the metallized integrated electrode finger 22 is relatively easily influenced by heat or vibrations that are generated from the excited first and second electrode fingers 13, 14. For this reason, particularly when the metallized integrated electrode finger 22 includes Al, electrochemical migration more easily occurs in the metallized integrated electrode finger 22 than in the first and second electrode fingers 13, 14. When electrochemical migration occurs in the metallized integrated electrode finger 22, not only the quality factor characteristics of the acoustic wave device easily degrade but also a failure of the acoustic wave device may occur because of a short circuit of the metallized integrated electrode finger 22 with the first and second electrode fingers 13, 14 and, as a result, the electric power handling capability may deteriorate.

Therefore, hereinafter, features and elements that significantly reduce occurrence of electrochemical migration in the metallized integrated electrode finger 22 will be described.

FIGS. 8A to 8D are cross-sectional views of interdigital transducer electrodes, taken along the acoustic wave propagation direction (direction perpendicular or substantially perpendicular to a direction in which the first and second electrode fingers 13, 14 extend) in modifications of the acoustic wave device according to the second preferred embodiment. FIGS. 8A to 8D show variations of the features and elements that significantly reduce occurrence of electrochemical migration.

In FIGS. 8A to 8D, each of the first and second electrode fingers 13, 14 and metallized integrated electrode fingers 22a to 22d includes a main electrode layer 23, a cap layer 24, and a close contact layer 25, provided on the piezoelectric body 4. The cap layer 24 is preferably made of, for example, Ti, and is laminated on a surface of the main electrode layer 23, opposite from the piezoelectric body 4. The close contact layer 25 is preferably made of, for example, Ti, and is laminated on a piezoelectric body 4-side surface of the main electrode layer 23. The close contact layer 25 is a layer provided to improve adhesion between the piezoelectric body 4 and each of the first and second electrode fingers 13, 14 and metallized integrated electrode fingers 22a to 22d.

Figure 8A:
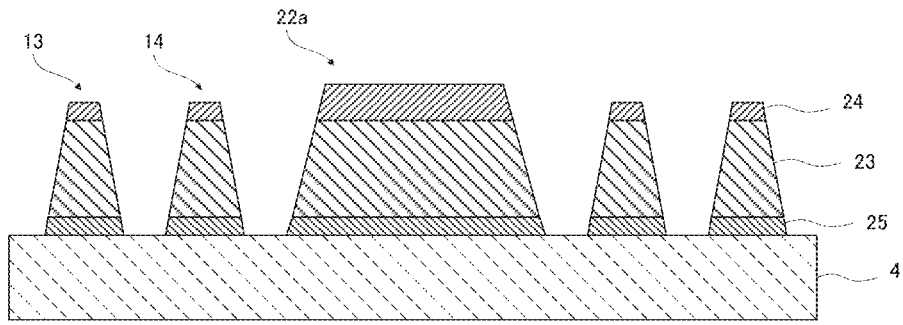
FIGS. 8A to 8D are cross-sectional views of interdigital transducer electrodes in modifications of the acoustic wave device according to the second preferred embodiment of the present invention.

In FIG. 8A, the main electrode layer 23 of each of the first and second electrode fingers 13, 14 and metallized integrated electrode finger 22a is preferably made of Al or a metal material including Al, for example, AlCu. The thickness of the cap layer 24 in the metallized integrated electrode finger 22a is greater than the thickness of the cap layer 24 in each of the first and second electrode fingers 13, 14. Ti that is the material of the cap layer 24 is difficult to undergo electrochemical migration as compared to Al included in the material of the main electrode layer 23 of each of the first and second electrode fingers 13, 14 and metallized integrated electrode finger 22a. For this reason, when the thickness of the cap layer 24 that is laminated in the metallized integrated electrode finger 22a that more easily undergoes electrochemical migration than the first and second electrode fingers 13, 14 is greater than the thickness of the cap layer 24 that is laminated in each of the first and second electrode fingers 13, 14, occurrence of electrochemical migration in the metallized integrated electrode finger 22a can be significantly reduced even when Al is included in the material of the main electrode layer 23 of the metallized integrated electrode finger 22a.

The material of the cap layer 24 is not limited to Ti. Examples of the material of the cap layer 24 may include Mo, Cu, W, Au, and Pt. These materials are also difficult to undergo electrochemical migration as compared to Al, so occurrence of electrochemical migration in the metallized integrated electrode finger 22a can be significantly reduced when any one of these materials is used as the material of the cap layer 24.

The cap layer 24 need not be laminated in each of the first and second electrode fingers 13, 14. In other words, the thickness of the cap layer 24 laminated in each of the first and second electrode fingers 13, 14 may be zero. In this case as well, as long as the cap layer 24 is laminated in the metallized integrated electrode finger 22a, occurrence of electrochemical migration in the metallized integrated electrode finger 22a can be significantly reduced.

Figure 8B:
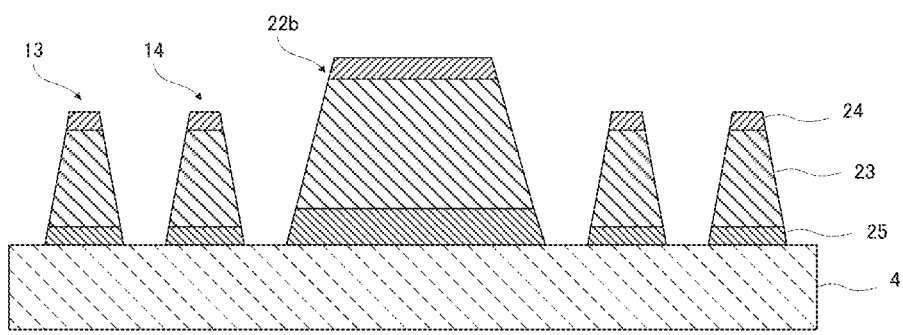

In FIG. 8B, the main electrode layer 23 of each of the first and second electrode fingers 13, 14 and metallized integrated electrode finger 22b is preferably made of Al or a metal material including Al, for example, AlCu. The thickness of the close contact layer 25 in the metallized integrated electrode finger 22b is greater than the thickness of the close contact layer 25 in each of the first and second electrode fingers 13, 14. In this way, when the thickness of the close contact layer 25 that is laminated in the metallized integrated electrode finger 22b that more easily undergo electrochemical migration than the first and second electrode fingers 13, 14 is made greater than those of the first and second electrode fingers 13, 14 as well, occurrence of electrochemical migration in the metallized integrated electrode finger 22b can be significantly reduced even when Al is included in the material of the metallized integrated electrode finger 22b.

The material of the close contact layer 25 is not limited to Ti and may be, for example, Mo, Cu, W, Au, Pt, or the like.

Figure 8C:
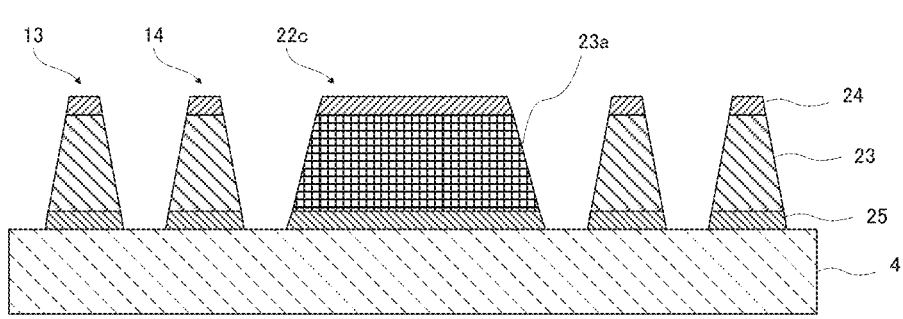

In FIG. 8C, the main electrode layer 23 of each of the first and second electrode fingers 13, 14 is preferably made of Al or a metal material including Al, for example, AlCu. The main electrode layer 23 of the metallized integrated electrode finger 22c is preferably made of a material other than Al, or a metal material including the material other than Al, and does not include Al. Examples of the material of the main electrode layer 23 of the metallized integrated electrode finger 22c include Ti, Mo, Cu, W, Au, and Pt. These materials are difficult to undergo electrochemical migration as compared to Al, so, when any one of these materials is used as the material of the main electrode layer 23 of the metallized integrated electrode finger 22c, occurrence of electrochemical migration in the metallized integrated electrode finger 22c can be significantly reduced as compared to when Al is included in the material of the main electrode layer 23 of the metallized integrated electrode finger 22c.

When the material of the main electrode layer 23 of each of the first and second electrode fingers 13, 14 is AlCu, the material of the main electrode layer 23 of the metallized integrated electrode finger 22c may be AlCu. At this time, when the concentration of Cu in the main electrode layer 23 of the metallized integrated electrode finger 22c is made higher than the concentration of Cu in the main electrode layer 23 of each of the first and second electrode fingers 13, 14, occurrence of electrochemical migration in the metallized integrated electrode finger 22c can be significantly reduced even when Al is included in the material of the main electrode layer 23 of the metallized integrated electrode finger 22c.

Figure 8D:
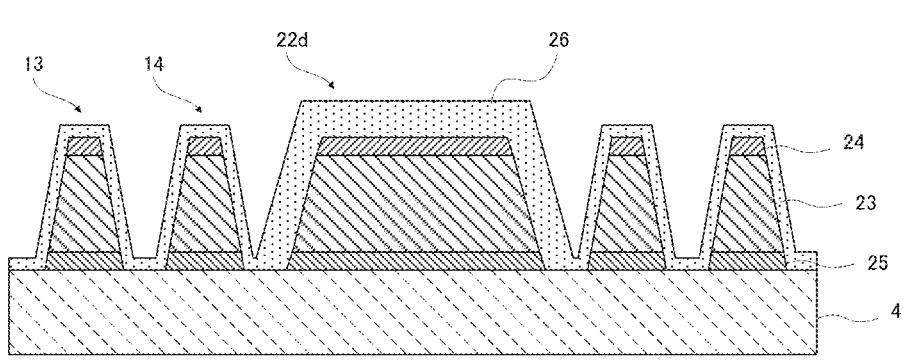

In FIG. 8D, the main electrode layer 23 of each of the first and second electrode fingers 13, 14 and the main electrode layer 23 of the metallized integrated electrode finger 22d is preferably made of Al or a metal material including Al, for example, AlCu. The first and second electrode fingers 13, 14 and the metallized integrated electrode finger 22d all are covered with a dielectric film 26. The thickness of the dielectric film 26 that covers the metallized integrated electrode finger 22d is greater than the thickness of the dielectric film 26 that covers the first and second electrode fingers 13, 14. Thus, because the metallized integrated electrode finger 22d that more easily undergoes electrochemical migration than the first and second electrode fingers 13, 14 are covered with a relatively thick dielectric film, occurrence of electrochemical migration in the metallized integrated electrode finger 22d can be significantly reduced even when Al is included in the material of the main electrode layer 23 of the metallized integrated electrode finger 22d.

In the interdigital transducer electrodes respectively shown in FIGS. 8A to 8D, each of the first and second electrode fingers 13, 14 and the metallized integrated electrode fingers 22a to 22d includes the cap layer 24 and the close contact layer 25. Alternatively, the first and second electrode fingers 13, 14 and the metallized integrated electrode fingers 22a to 22d each need not include at least one of the cap layer 24 and the close contact layer 25.

Next, the fact that the quality factor is degraded and no good resonant characteristics are obtained from ordinary withdrawal weighting, weighting applied by providing a polarity inverted portion, or weighting applied by providing an electrode finger removal portion will be described with reference to FIG. 9 to FIG. 17. Comparative Example 1 (described later) is an acoustic wave device to which no weighting is applied. Comparative Example 2 is an acoustic wave device to which ordinary withdrawal weighting is applied. Comparative Example 3 is an acoustic wave device to which weighting is applied by providing a polarity inverted portion. Comparative Example 4 is an acoustic wave device to which weighting is applied by providing an electrode finger removal portion.

Figure 9:
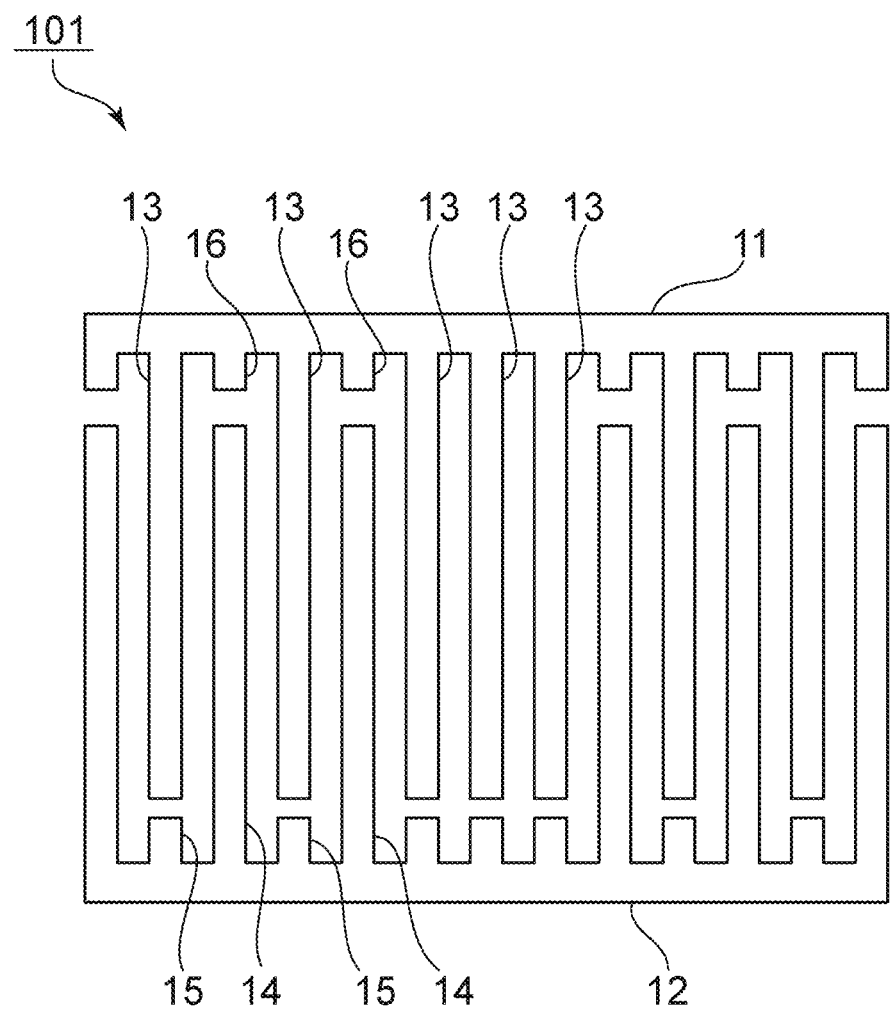
FIG. 9 is a plan view that shows an interdigital transducer electrode of an acoustic wave device of Comparative Example 2.

FIG. 9 is a plan view that shows an interdigital transducer electrode 101 of the acoustic wave device of Comparative Example 2. The plurality of first electrode fingers 13 and the plurality of second electrode fingers 14 are alternately provided in the acoustic wave propagation direction. In a center region, a portion made up of three successive first electrode fingers 13 is provided. In other words, in Comparative Example 2, the second electrode finger 14 is withdrawn, so a periodic structure in which the first electrode finger 13 and the second electrode finger 14 are alternately provided is partially interrupted.

Figure 10:
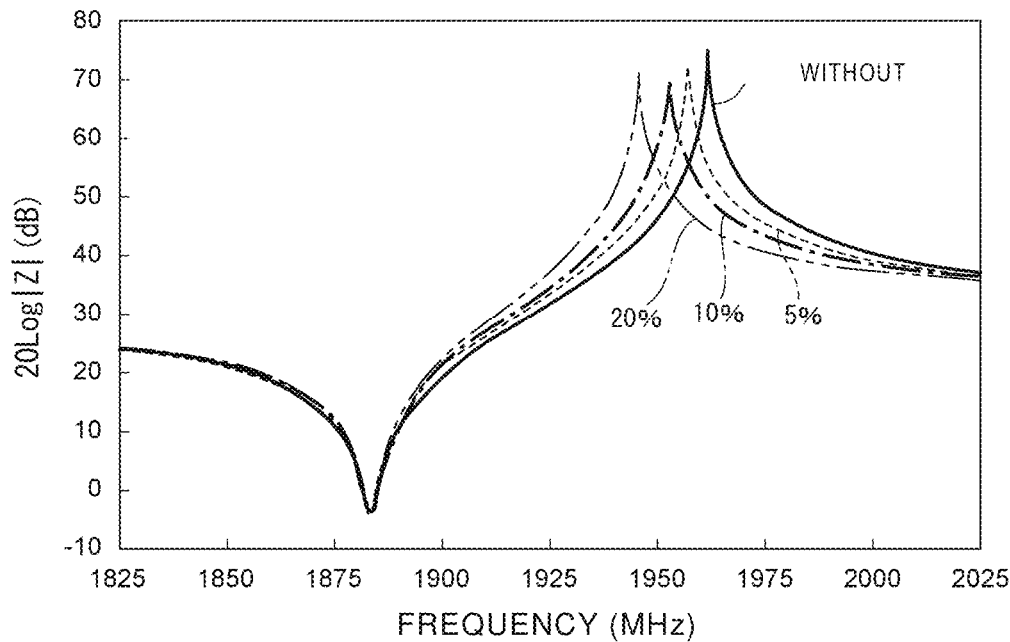
FIG. 10 is a graph that shows the resonant characteristics of Comparative Example 1 in which no weighting is applied and the resonant characteristics of each of the acoustic wave devices whose percentage of withdrawal is about 5%, about 10%, or about 20% in Comparative Example 2.
Figure 11:
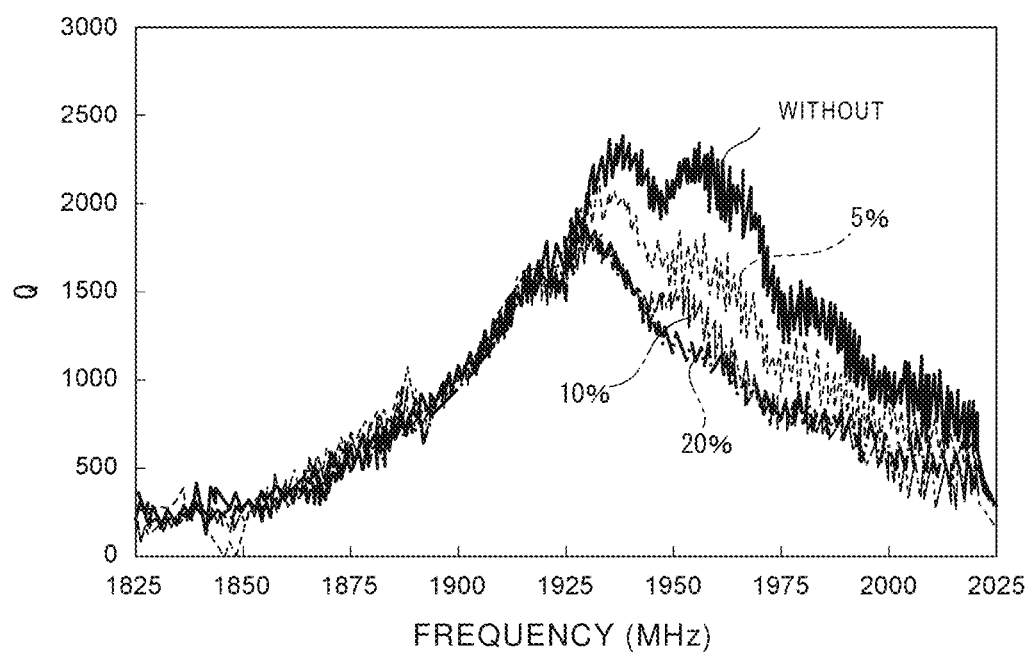
FIG. 11 is a graph that shows the quality factor characteristics of Comparative Example 1 in which no weighting is applied and the quality factor characteristics of each of the acoustic wave devices whose percentage of withdrawal is about 5%, about 10%, or about 20% in Comparative Example 2.

FIG. 10 is a graph that shows the resonant characteristics of the acoustic wave device of Comparative Example 1 to which no weighting is applied and the resonant characteristics of each of the acoustic wave devices whose percentage of ordinary withdrawal weighting is about 5%, about 10%, or about 20% in Comparative Example 2. FIG. 11 is a graph that shows the quality factor characteristics of the acoustic wave device of Comparative Example 1 and the quality factor characteristics of each of the acoustic wave devices whose percentage of ordinary withdrawal weighting is about 5%, about 10%, or about 20% in Comparative Example 2.

As is apparent from FIG. 10, when ordinary withdrawal weighting is applied as well, the fractional band width can be adjusted in a direction to narrow by increasing the percentage of weighting. As is apparent from a comparison of FIG. 10 with FIG. 3 and FIG. 6, the impedance ratio tends to degrade as weighting is increased in ordinary withdrawal weighting. As is apparent from a comparison of FIG. 11 with FIG. 4 and FIG. 7, the quality factor is significantly degraded in ordinary withdrawal weighting as compared to weighting applied by providing a floating electrode finger or weighting applied by providing a metallized integrated electrode finger.

Figure 12:
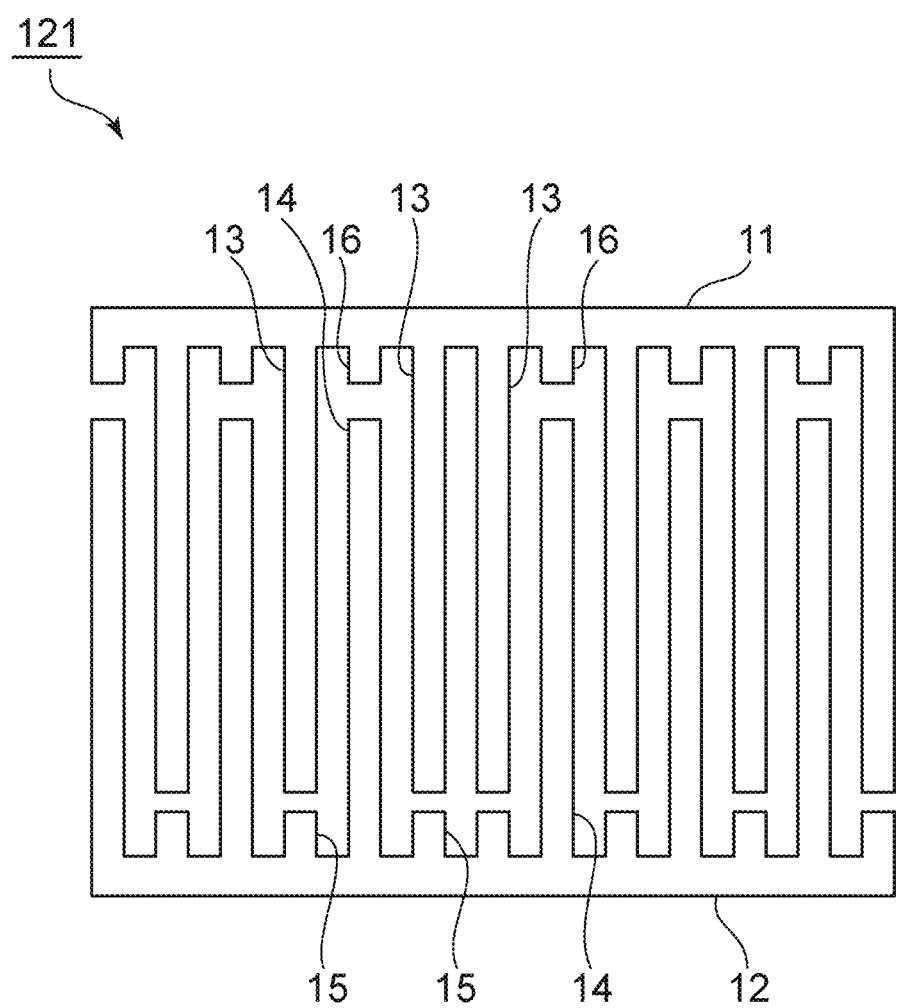
FIG. 12 is a plan view that shows an interdigital transducer electrode of an acoustic wave device of Comparative Example 3.
Figure 13:
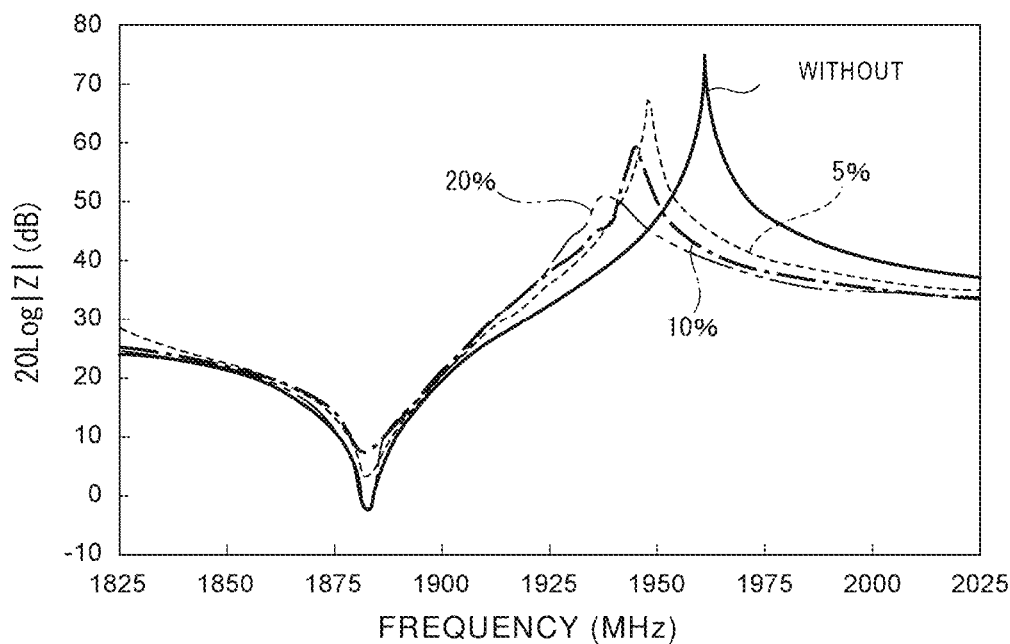
FIG. 13 is a graph that shows the resonant characteristics of Comparative Example 1 and the resonant characteristics of each of the acoustic wave devices whose percentage of electrode fingers having an inverted polarity is about 5%, about 10%, or about 20% in Comparative Example 3.
Figure 14:
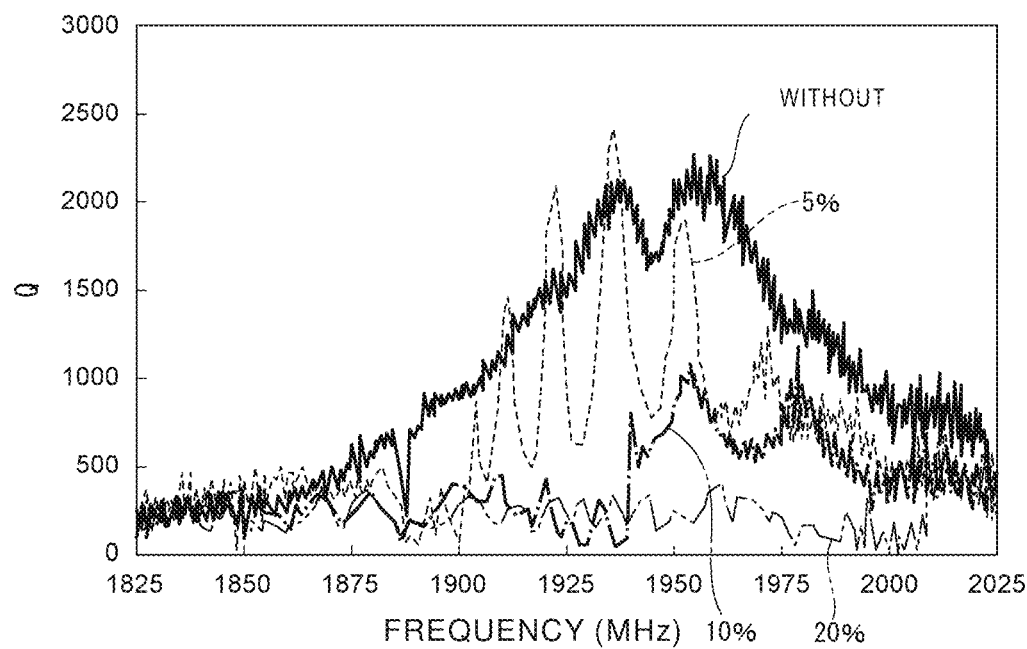
FIG. 14 is a graph that shows the quality factor characteristics of Comparative Example 1 and the quality factor characteristics of each of the acoustic wave devices whose percentage of electrode fingers having an inverted polarity is about 5%, about 10%, or about 20% in Comparative Example 3.

FIG. 12 is a plan view that shows an interdigital transducer electrode 121 of the acoustic wave device of Comparative Example 3. In the interdigital transducer electrode 121, a portion where two first electrode fingers 13 are next to each other is provided at the center of the interdigital transducer electrode 121 in the acoustic wave propagation direction. In other words, weighting is applied by providing a polarity inverted portion inverted in polarity at the center of the interdigital transducer electrode 121 in the acoustic wave propagation direction in Comparative Example 3. FIG. 13 is a graph that shows the resonant characteristics of Comparative Example 1 to which no weighting is applied and the resonant characteristics of each of the acoustic wave devices whose percentage of polarity inverted weighting is about 5%, about 10%, or about 20% in Comparative Example 3. FIG. 14 is a graph that shows the quality factor characteristics of the acoustic wave device of Comparative Example 1 and the quality factor characteristics of each of the acoustic wave devices whose percentage of polarity inverted weighting is about 5%, about 10%, or about 20% in Comparative Example 3.

As is apparent from a comparison of FIG. 13 with FIG. 3 and FIG. 6, when polarity inverted weighting is applied, the impedance ratio is significantly degraded with an increase in the percentage of weighting although the fractional band width can be narrowed. As is apparent from a comparison of FIG. 14 with FIG. 4 and FIG. 7, the quality factor in inverted polarity weighting is significantly degraded as compared to weighting applied by providing a floating electrode finger or weighting applied by providing a metallized integrated electrode finger.

Figure 15:
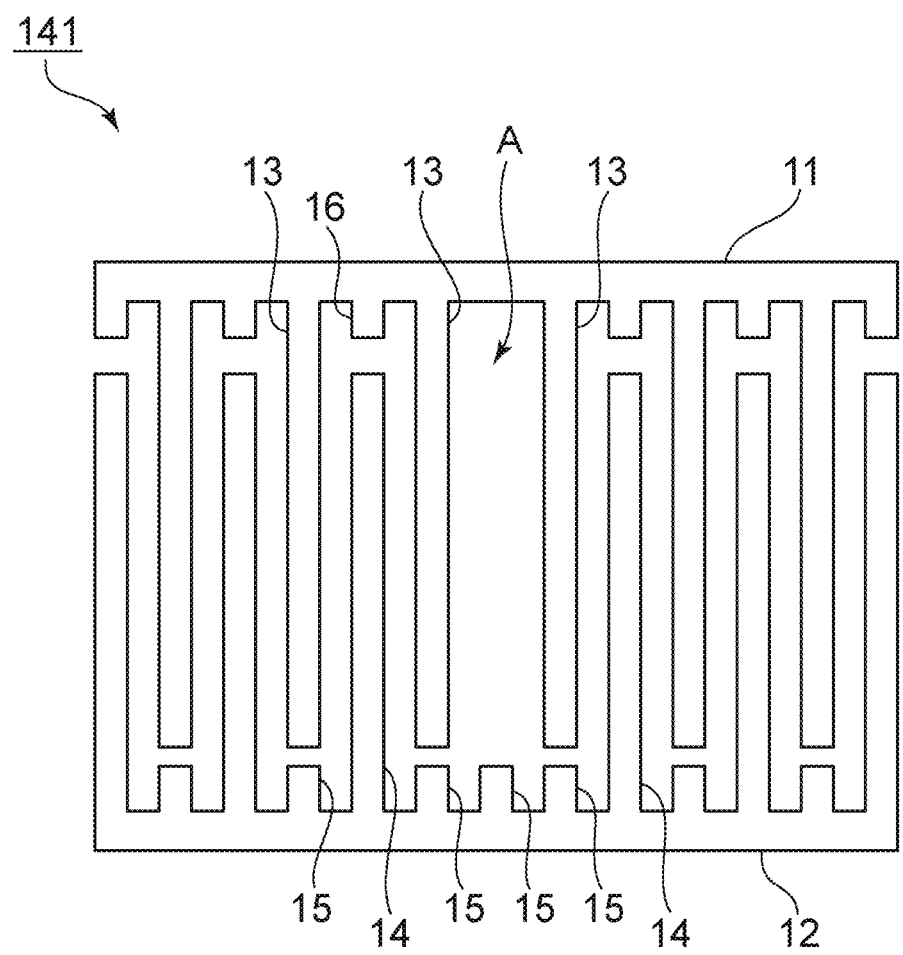
FIG. 15 is a plan view that shows an interdigital transducer electrode of an acoustic wave device of Comparative Example 4.

FIG. 15 is a plan view of an interdigital transducer electrode 141 of the acoustic wave device of Comparative Example 4. In Comparative Example 4, an electrode finger removal portion indicated by the arrow A is provided at the center in the acoustic wave propagation direction in the interdigital transducer electrode 141.

Figure 16:
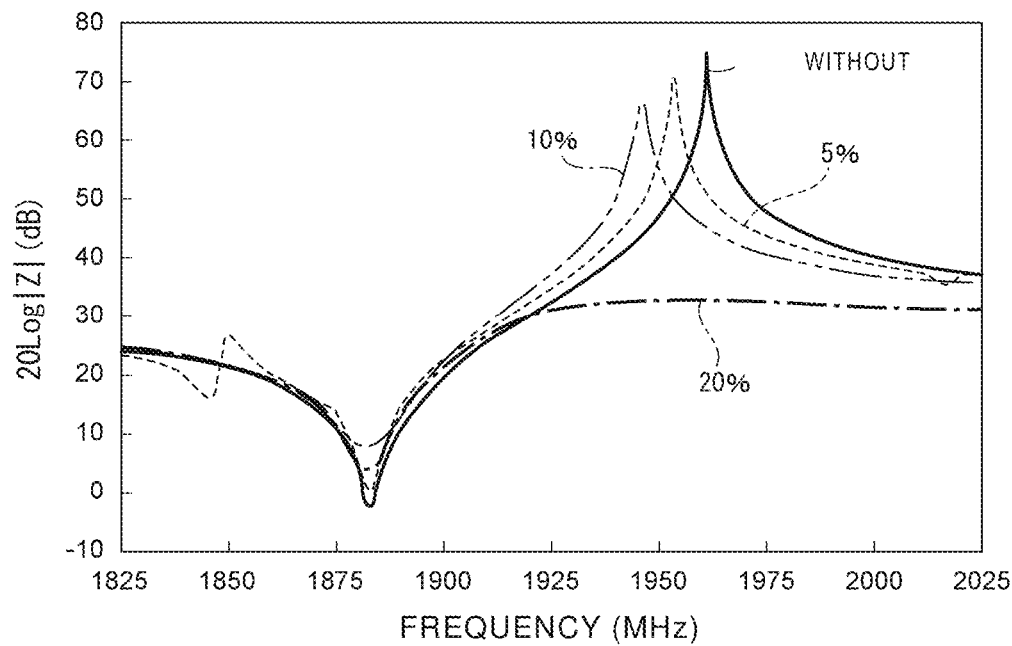
FIG. 16 is a graph that shows the resonant characteristics of Comparative Example 1 and the resonant characteristics of each of the acoustic wave devices whose percentage of weighting applied by removing electrode fingers is about 5%, about 10%, or about 20% in Comparative Example 4.

FIG. 16 is a graph that shows the resonant characteristics of the acoustic wave device of Comparative Example 1 and the resonant characteristics of each of the acoustic wave devices whose percentage of electrode finger removal weighting is about 5%, about 10%, or about 20% in Comparative Example 4.

Figure 17:
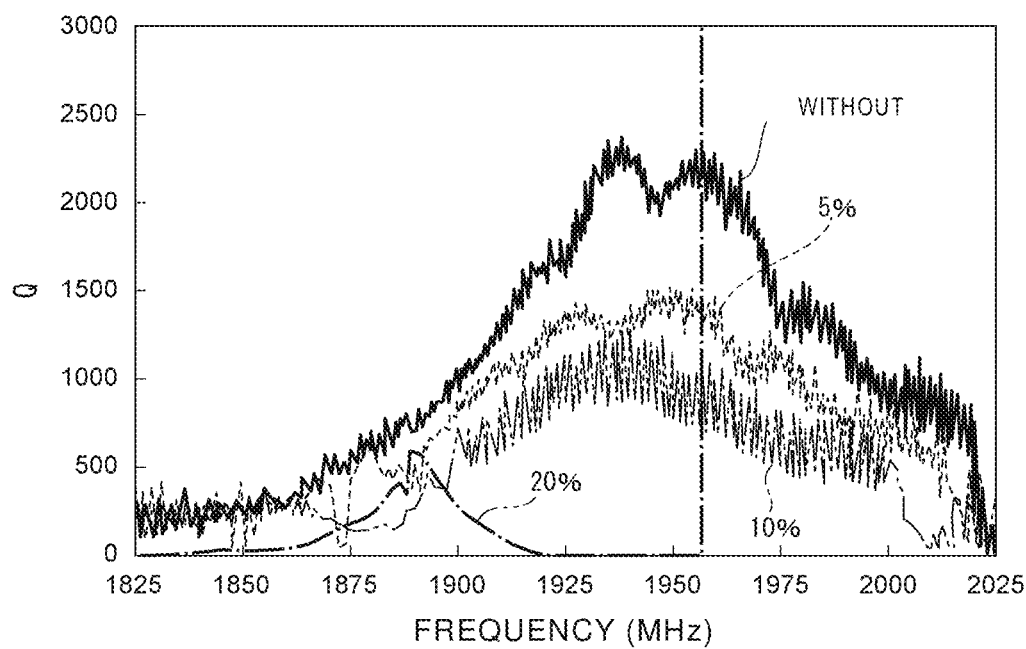
FIG. 17 is a graph that shows the quality factor characteristics of Comparative Example 1 and the quality factor characteristics of each of the acoustic wave devices whose percentage of weighting applied by removing electrode fingers is about 5%, about 10%, or about 20% in Comparative Example 4.

FIG. 17 is a graph that shows the quality factor characteristics of the acoustic wave device of Comparative Example 1 and the quality factor characteristics of each of the acoustic wave devices whose percentage of electrode finger removal weighting is about 5%, about 10%, or about 20% in Comparative Example 4.

As is apparent from a comparison of FIG. 16 with FIG. 3 and FIG. 6, the fractional band width can be adjusted to narrow by applying weighting in Comparative Example 4 as well. However, the impedance ratio is considerably degraded because of weighting. As is apparent from a comparison of FIG. 17 with FIG. 4 and FIG. 7, the quality factor is significantly degraded in weighting applied by providing an electrode finger removal portion as compared to weighting applied by providing a floating electrode finger or weighting applied by providing a metallized integrated electrode finger.

In other words, as is apparent from FIG. 9 to FIG. 17, when the fractional band width is adjusted by using ordinary withdrawal weighting, polarity inverted weighting, or electrode finger removal weighting, the quality factor is degraded, and the impedance ratio is also degraded as the percentage of weighting increases.

In contrast to this, as shown in FIG. 3, FIG. 4, FIG. 6, and FIG. 7, when weighting of the first preferred embodiment using a floating electrode finger or weighting of the second preferred embodiment using a metallized integrated electrode finger is applied, degradation of the impedance ratio and degradation of the quality factor are difficult to occur. Therefore, the fractional band width of the acoustic wave device can be adjusted without degradation of the resonant characteristics or quality factor.

Figure 18:
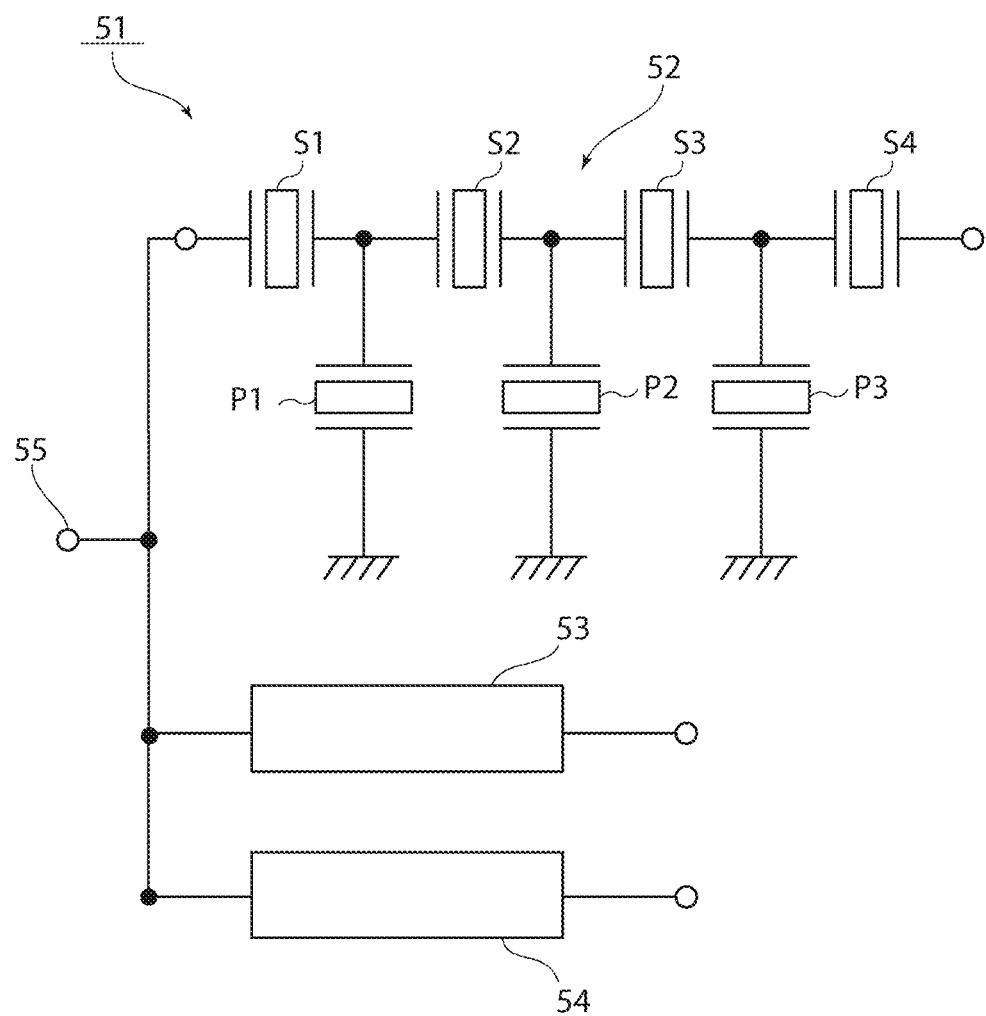
FIG. 18 is a circuit diagram of a combined filter device of a third preferred embodiment of the present invention.

FIG. 18 is a circuit diagram of a combined filter device of a third preferred embodiment of the present invention. The combined filter device 51 includes a first filter 52, a second filter 53, and a third filter 54. One ends of the first to third filters 52 to 54 are connected in common by an antenna terminal 55. The first filter 52 is a ladder filter including a plurality of acoustic wave resonators. The first filter 52 includes series arm resonators S1 to S4 and parallel arm resonators P1 to P3.

In the first filter 52, each of the series arm resonators S1 to S4 and the parallel arm resonators P1 to P3 is an acoustic wave resonator and is the acoustic wave device 1 of the first preferred embodiment. Particularly, in each of the series arm resonators S1 to S4, the steepness of the filter characteristics can be increased by increasing the percentage of weighting applied by providing a floating electrode finger in the first preferred embodiment. In other words, by narrowing the fractional band width of at least one of the series arm resonators S1 to S4, the attenuation in a frequency range close to the pass band at lower frequencies than the pass band can be increased in the ladder filter. Thus, the steepness can be significantly increased.

Therefore, when the acoustic wave device 1 is used for at least one of the series arm resonators S1 to S4, the steepness of the filter characteristics can be significantly increased. In addition, in this case, degradation of the quality factor is also difficult to occur, so good filter characteristics are obtained.

Preferably, for example, in the first filter 52, at least one of the series arm resonators S2 to S4 and the parallel arm resonators P1 to P3, other than the series arm resonator S1, is the acoustic wave device 1. In the first filter 52, the resonator closest to the antenna terminal, that is, the resonator closest to the common connection side, is the series arm resonator S1. When the resonator closest to the common connection side is the acoustic wave device 1 of a preferred embodiment of the present invention, a large higher mode that influences another one of the filters connected in common, for example, the second filter 53 or the third filter 54, may occur. In other words, such a higher mode may lie in the pass band of the second filter 53 or the third filter 54. Therefore, at least one of the series arm resonators S2 to S4 and the parallel arm resonators P1 to P3, which are remaining resonators other than the series arm resonator S1 closest to the common connection side on which the influence is large, is preferably the acoustic wave device 1, for example.

Figure 19:
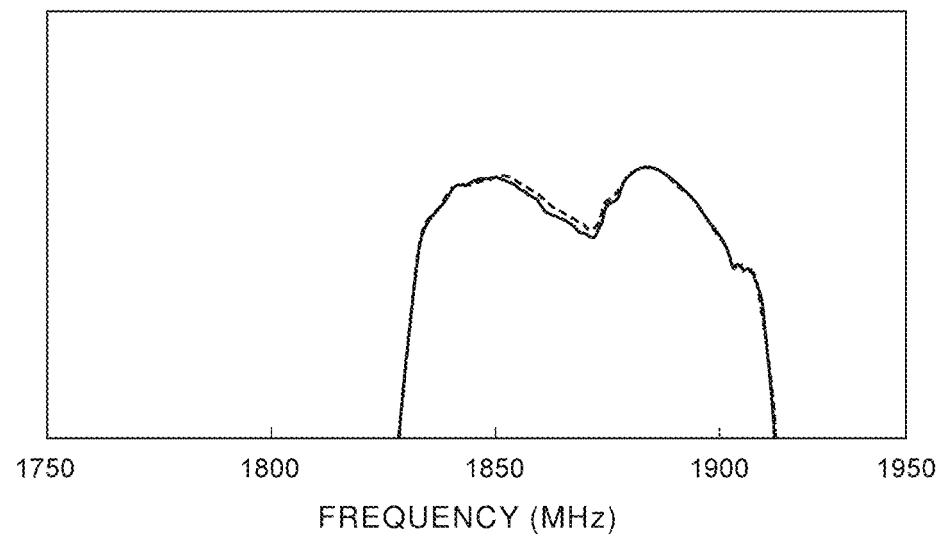
FIG. 19 is a graph that shows the filter characteristics of a ladder filter before and after an electric power handling test in the combined filter device shown in FIG. 17.

FIG. 19 is a graph that shows an example of the filter characteristics of the combined filter device of the third preferred embodiment. The inventors of preferred embodiments of the present invention conducted an electric power handling capability test as described below on the first filter 52 for which the acoustic wave device 1 of the first preferred embodiment was used. In other words, an electric power of about 1.2 W was applied for about 40 hours at a temperature of about 120° C. In FIG. 19, the dashed line represents filter characteristics before the test, and the solid line represents filter characteristics after about 40 hours. It is clear from FIG. 19 that the filter characteristics almost have not changed. With weighting applied by providing a floating electrode finger as described above, when an electric power handling capability test is performed, electrochemical migration between electrode fingers is difficult to occur. Therefore, the electric power handling capability can be significantly improved.

As described above, the inventors of preferred embodiments of the present invention discovered for the first time that, in an acoustic wave device having a structure that a low acoustic velocity material layer and a piezoelectric body are laminated on a support substrate including a high acoustic velocity material, weighting applied by providing a floating electrode finger and weighting applied by providing a metallized integrated electrode finger among types of weighting do not cause the quality factor to degrade and provide good resonant characteristics. Such a difference depending on the type of weighting is peculiar to an acoustic wave device having the above-described multilayer structure and is not found in an existing acoustic wave device in which an interdigital transducer electrode is provided on a piezoelectric substrate. This will be described with reference to FIG. 20 to FIG. 24.

Acoustic Wave Devices of Reference Examples

As an acoustic wave device of Reference Example 1, an acoustic wave device in which an interdigital transducer electrode and a pair of reflectors were provided on a piezoelectric body including LiTaO$_3$ was prepared. LiTaO$_3$ having a cut angle of about 42° Y was used. The design parameters of the interdigital transducer electrode were as follows. In Reference Example 1, no weighting was applied. The number of pairs of electrode fingers was 100, the number of electrode fingers was 201, and the overlap width was about 40 μm. The wave length determined by the electrode finger pitch was about 2 μm, and the number of electrode fingers in each reflector was 21. The multilayer structure of each of the interdigital transducer electrode and reflectors was Ti/Al-1% Cu alloy/Ti, and the thicknesses of the layers Ti/Al-1% Cu alloy/Ti were respectively about 4 nm, about 145 nm, and about 12 nm.

As Reference Example 2, except that weighting was applied by providing 20 floating electrode fingers in an interdigital transducer electrode, an acoustic wave device of Reference Example 2 was manufactured similarly to the Reference Example 1.

Figure 20:
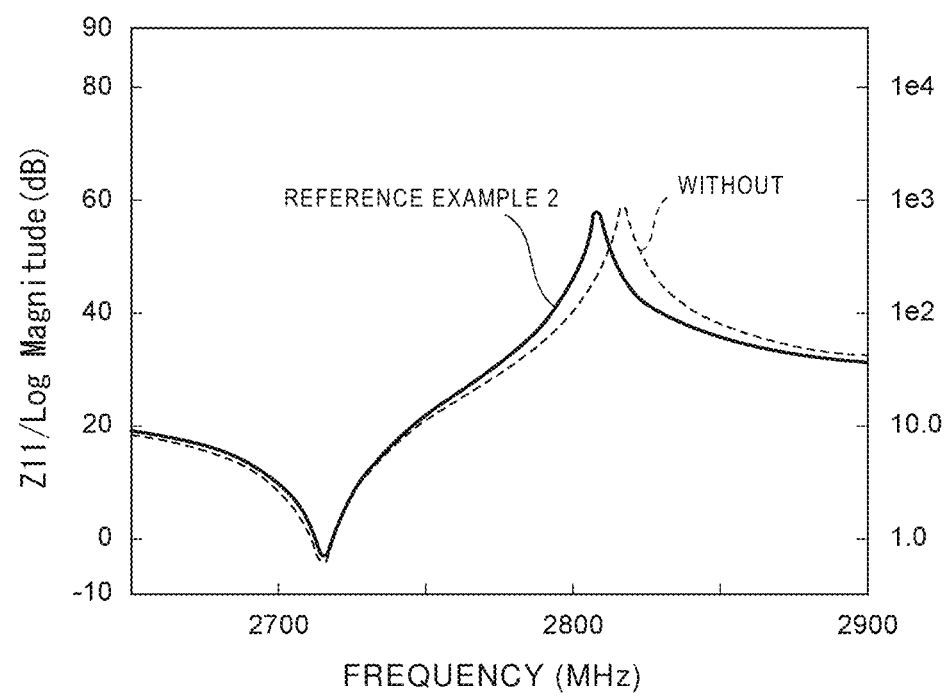
FIG. 20 is a graph that shows the resonant characteristics of Reference Example 1 in which no weighting is applied in an acoustic wave resonator and the resonant characteristics of Reference Example 2 in which weighting is applied by providing a floating electrode finger.
Figure 21:
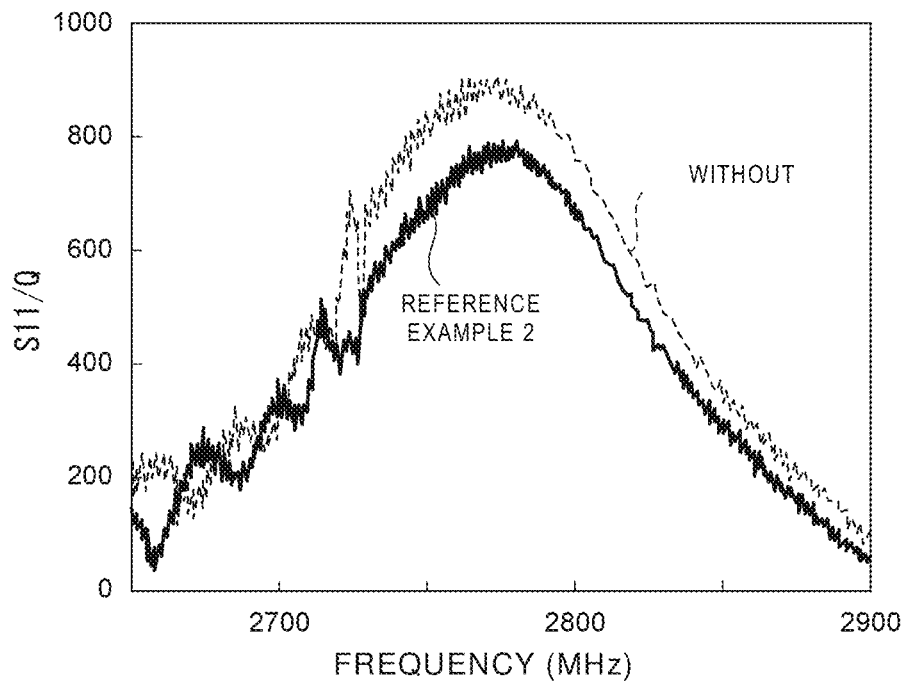
FIG. 21 is a graph that shows the quality factor characteristics of Reference Example 1 in which no weighting is applied in an acoustic wave resonator and the quality factor characteristics of Reference Example 2 in which weighting is applied by providing a floating electrode finger.

FIG. 20 shows the resonant characteristics of the acoustic wave devices of Reference Example 1 and Reference Example 2. FIG. 21 shows the quality factor characteristics. As is apparent from FIG. 20, the fractional band width can be narrowed by weighting. However, the impedance ratio has slightly reduced. As is apparent from FIG. 21, the quality factor is significantly degraded because of weighting.

EXAMPLE

As the Example, an acoustic wave device having the following design parameters was manufactured.

The support substrate 2 made of a high acoustic velocity material included Si (silicon) as a material.

The low acoustic velocity material layer 3 included silicon oxide as a material, and had a thickness of about 673 nm.

The piezoelectric body 4 was made of LiTaO$_3$ (lithium tantalate) having a cut angle of about 50° Y, and had a thickness of about 600 nm.

An acoustic wave device to which no weighting was applied as in the case of Reference Example 1 and the acoustic wave device of Example in which weighting was applied by providing a floating electrode finger as in the case of Reference Example 2 were manufactured.

Figure 22:
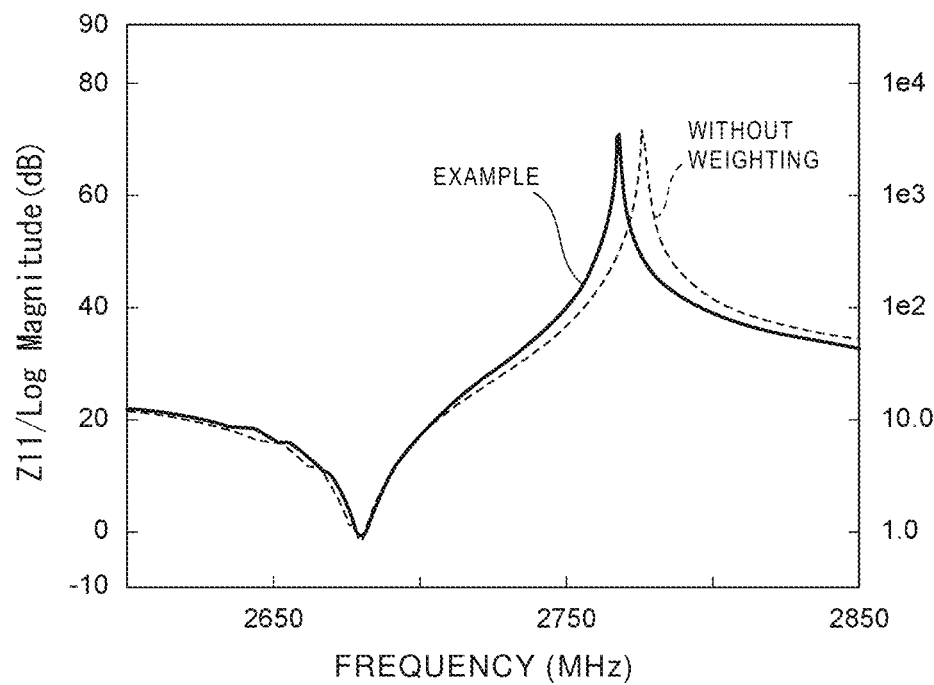
FIG. 22 is a graph that shows the resonant characteristics of a resonator in which no weighting is applied and the resonant characteristics of Example in which weighting is applied by providing a floating electrode finger.
Figure 23:
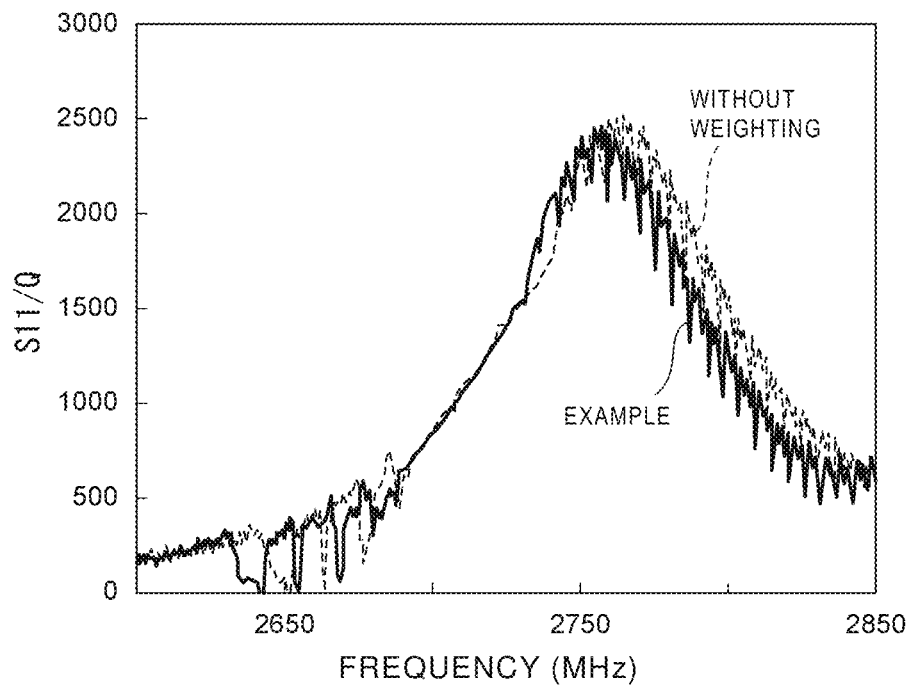
FIG. 23 is a graph that shows the quality factor characteristics of a resonator in which no weighting is applied and the quality factor characteristics of Example in which weighting is applied by providing a floating electrode finger.

FIG. 22 is a graph that shows the resonant characteristics of the acoustic wave device to which no weighting was applied and the resonant characteristics of the acoustic wave device to which weighting of Example was applied. FIG. 23 is a graph that shows the quality factor characteristics of the acoustic wave device to which no weighting was applied and the quality factor characteristics of the acoustic wave device to which weighting of Example was applied.

As is apparent from FIG. 22, it is clear that the fractional band width can also be narrowed by weighting in Example. The impedance ratio is sufficiently large and almost does not degrade even when weighting is applied. In addition, as shown in FIG. 23, the quality factor characteristics do not degrade even when weighting is applied.

As described above, it is clear that, in the existing acoustic wave device in which no high acoustic velocity material layer is provided below the piezoelectric body, the quality factor is degraded even when weighting is applied by using a floating electrode finger. In contrast to this, as is apparent from the result of Example, in the acoustic wave device having a structure that the low acoustic velocity material layer and the piezoelectric body are laminated on the support substrate including the high acoustic velocity material layer or the acoustic wave device having a structure that the piezoelectric body is laminated on the support substrate made from the high acoustic velocity material layer, an acoustic wave device that can not only narrow the band width but also has a good quality factor can be obtained by weighting applied by providing a floating electrode finger.

Figure 24:
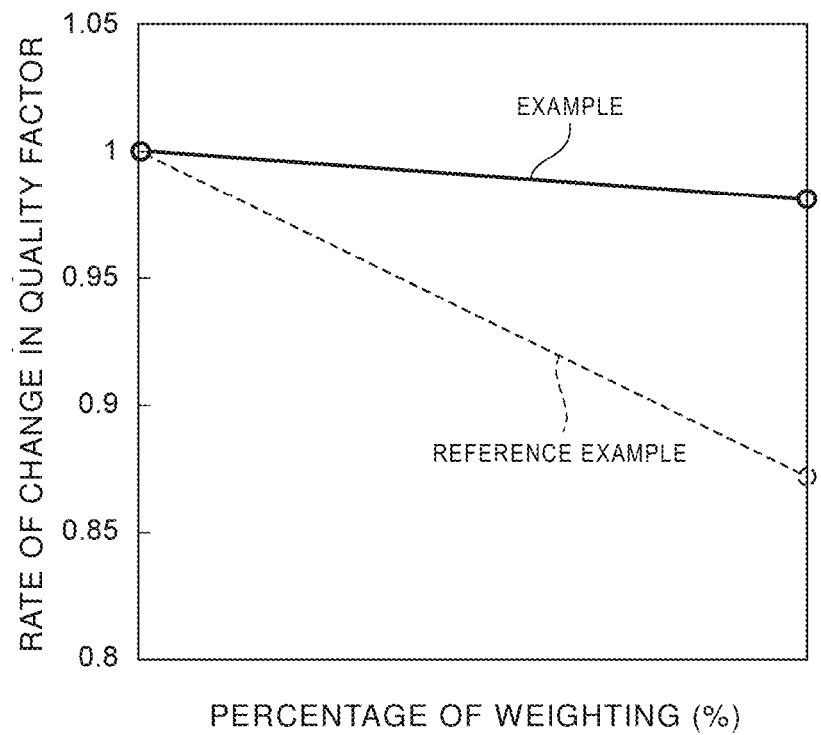
FIG. 24 is a graph that shows the relationship between the percentage of weighting applied by providing a floating electrode finger and the rate of change in quality factor in each of the acoustic wave device of Reference Example 2 and the acoustic wave device of Example.

FIG. 24 is a graph that shows the relationship between the percentage of weighting and the rate of change in quality factor in the case where the percentage of weighting is variously changed in Reference Example 2 and Example. The rate of change in quality factor was normalized where the quality factor in the case where no weighting was applied was one.

As is apparent from FIG. 24, in the acoustic wave device of Reference Example 2, the quality factor is degraded by a larger amount as the percentage of weighting increases. In contrast to this, in the acoustic wave device of Example, it is clear that the quality factor almost does not change even when the percentage of weighting is increased.

Figure 25:
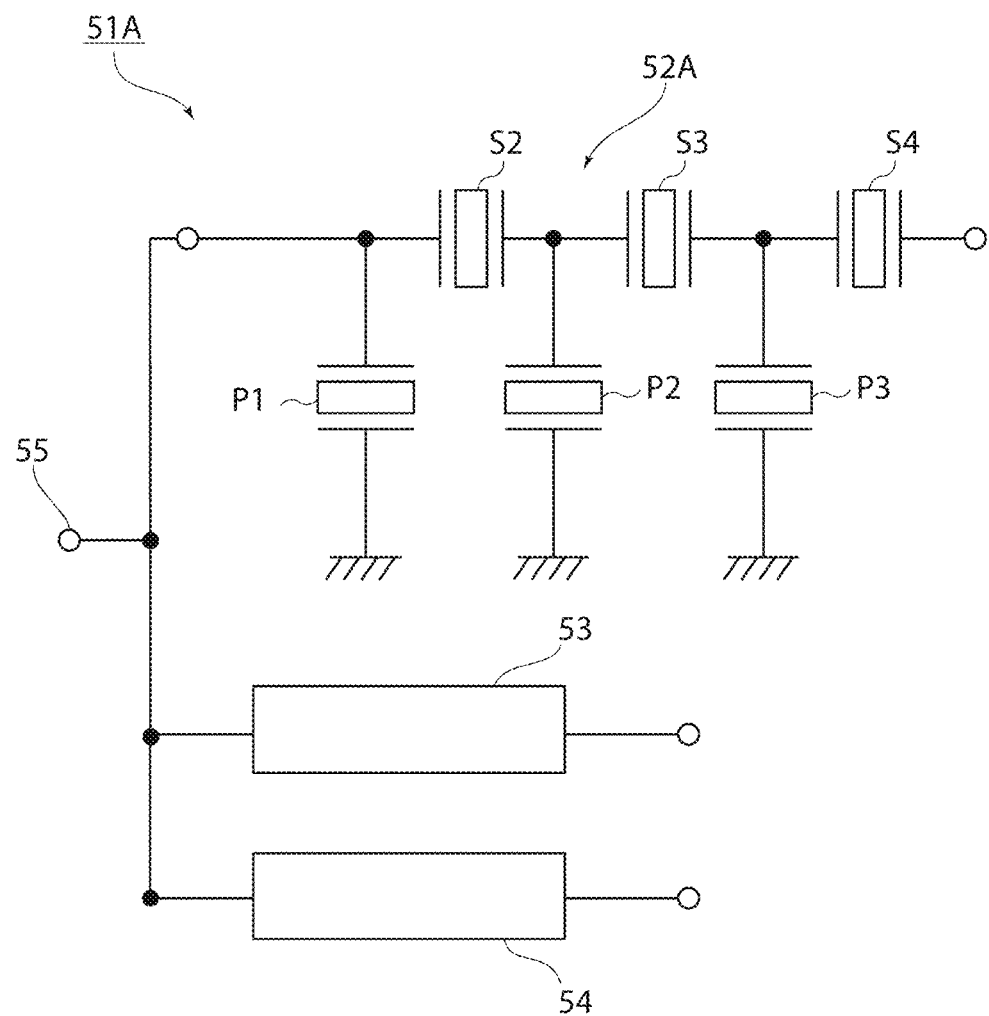
FIG. 25 is a circuit diagram that shows a modification of the combined filter device of the third preferred embodiment of the present invention.

FIG. 25 is a circuit diagram that shows a modification of the combined filter device of the third preferred embodiment. In a combined filter device 51A, a first filter 52A includes a plurality of series arm resonators S2, S3, S4 and parallel arm resonators P1, P2, P3, and has similar features and elements as the combined filter device 51 except that no series arm resonator S1 is provided.

In the combined filter device 51 of the third preferred embodiment shown in FIG. 18, the resonator closest to the antenna terminal is the series arm resonator S1. Alternatively, as in the case of the combined filter device 51A shown in FIG. 25, the resonator closest to the antenna terminal may be the parallel arm resonator P1. As described above, the acoustic wave resonator that is the acoustic wave device according to a preferred embodiment of the present invention is preferably not provided at a common connection side, that is, a position closes to the antenna terminal, in the first filter, for example. As described above, when the acoustic wave resonator to which weighting is applied by providing a floating electrode finger or metallization according to a preferred embodiment of the present invention is close to the antenna terminal, the other second filter 53 or third filter 54 connected in common may be influenced by a higher mode. In the first filter 52 of the combined filter device 51, the series arm resonator S1 is preferably not the acoustic wave resonator according to a preferred embodiment of the present invention, for example. However, in the combined filter device 51A, the parallel arm resonator P1 and the series arm resonator S2 closest to the antenna terminal are preferably not an acoustic wave resonator in accordance with a preferred embodiment of the present invention, for example.

Thus, in the case of the first filter 52A in the combined filter device 51A, at least one of the resonators, other than the series arm resonator S2 closest to the antenna terminal and the parallel arm resonator P2, is preferably the acoustic wave resonator according to a preferred embodiment of the present invention, for example.

In the first preferred embodiment, the low acoustic velocity material layer 3 is laminated between the piezoelectric body 4 and the support substrate 2 that is the high acoustic velocity material layer. However, the low acoustic velocity material layer 3 may be omitted. In other words, the piezoelectric body 4 may be directly laminated on the high acoustic velocity material layer.

An acoustic reflection layer including a low acoustic impedance layer having a relatively low acoustic impedance and a high acoustic impedance layer having a relatively high acoustic impedance may be laminated between the support substrate 2 and the piezoelectric body 4.

Figure 26:
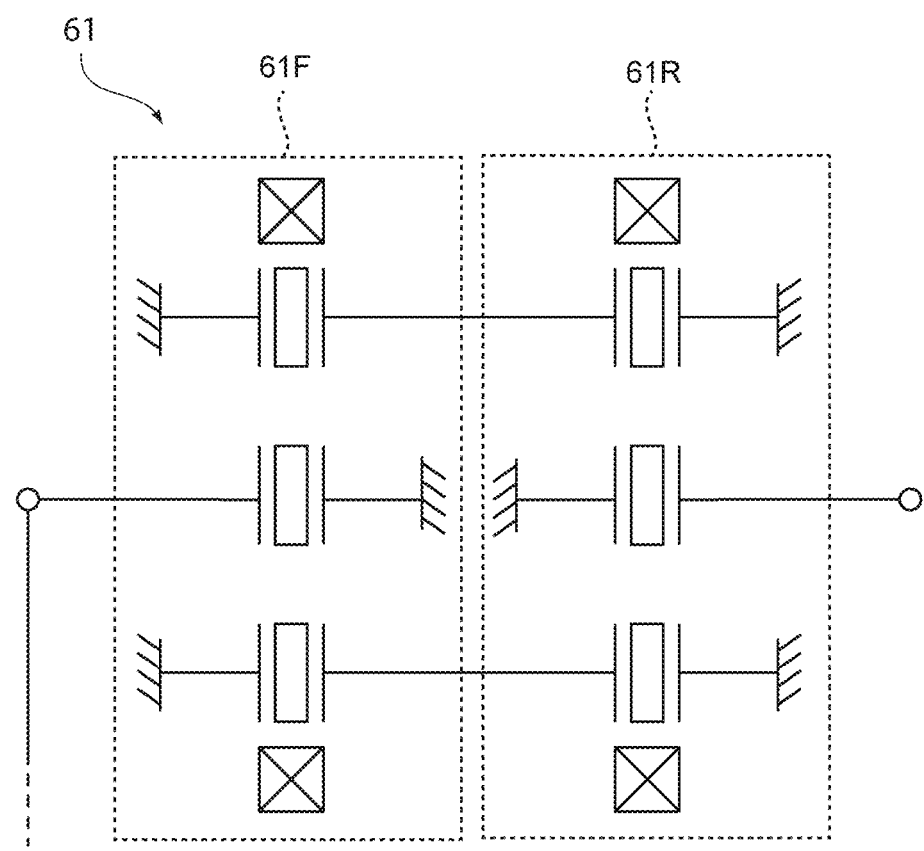
FIG. 26 is a circuit diagram that shows one band pass filter of a combined filter device according to a fourth preferred embodiment of the present invention.

FIG. 26 is a circuit diagram that shows a first filter of a combined filter device of a fourth preferred embodiment of the present invention. The first filter 61 is connected in common together with second and third filters (not shown) at the antenna terminal side. The first filter 61 includes a preceding longitudinally coupled resonator acoustic wave filter 61F and a subsequent longitudinally coupled resonator acoustic wave filter 61R. The longitudinally coupled resonator acoustic wave filter 61F is connected to a common connection terminal. The subsequent longitudinally coupled resonator acoustic wave filter 61R is connected to the longitudinally coupled resonator acoustic wave filter 61F.

The longitudinally coupled resonator acoustic wave filters 61F, 61R are each preferably a three-IDT longitudinally coupled resonator acoustic wave filter.

The first filter 61 including the longitudinally coupled resonator acoustic wave filters 61F, 61R in this way may be an acoustic wave device according to a preferred embodiment of the present invention. In other words, the acoustic wave device according to a preferred embodiment of the present invention is not limited to a one-port acoustic wave resonator and may be a longitudinally coupled resonator acoustic wave filter. In this case, preferably, for example, the longitudinally coupled resonator acoustic wave filter 61F closest to the common connection terminal is not provided in accordance with a preferred embodiment of the present invention and the acoustic wave device according to a preferred embodiment of the present invention is applied to the remaining longitudinally coupled resonator acoustic wave filter 61R. Thus, adverse influence due to a higher mode on another band pass filter connected in common is difficult to occur.

Figure 27:
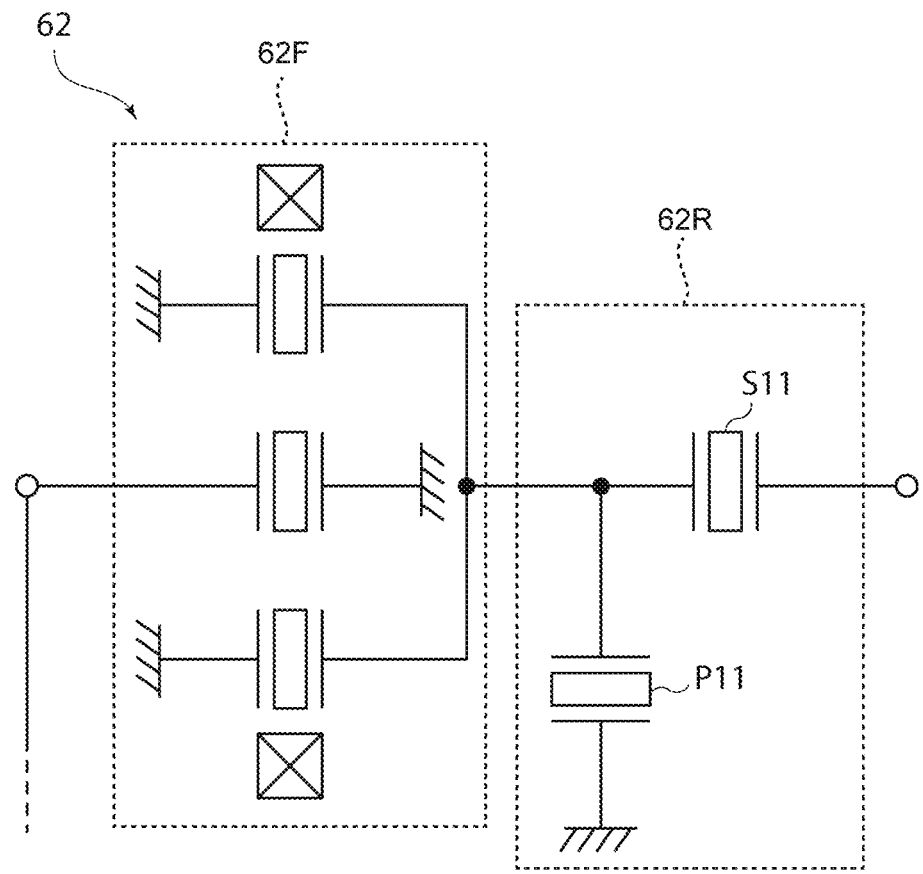
FIG. 27 is a circuit diagram that shows one band pass filter of a combined filter device according to a fifth preferred embodiment of the present invention.

FIG. 27 is a circuit diagram that shows a first filter of a combined filter device of a fifth preferred embodiment of the present invention. In the first filter 62, one end of a three-IDT longitudinally coupled resonator acoustic wave filter 62F is connected to a common connection terminal. A ladder filter 62R is connected to the other end of the longitudinally coupled resonator acoustic wave filter 62F. The ladder filter 62R includes a series arm resonator S11 and a parallel arm resonator P11. In this way, a filter to which the acoustic wave device according to a preferred embodiment of the present invention is applied may have a structure that the longitudinally coupled resonator acoustic wave filter 62F and the ladder filter 62R are connected. Instead of the ladder filter 62R, only a series arm resonator may be used, or only a parallel arm resonator may be used. Furthermore, the number of poles in the ladder filter 62R is not limited to one and may be two or more.

A preceding longitudinally coupled resonator acoustic wave filter 62F may also have multiple stages, similar to the first filter 61 shown in FIG. 26.

In the first filter 62 as well, the longitudinally coupled resonator acoustic wave filter 62F and the ladder filter 62R each may be an acoustic wave device according to a preferred embodiment of the present invention. Preferably, for example, at least one of the series arm resonator S11 and the parallel arm resonator P11 that are the remaining resonators, other than the longitudinally coupled resonator acoustic wave filter 62F that is the resonator close to the antenna terminal, that is, the resonator closest to the common connection side, is the acoustic wave device according to a preferred embodiment of the present invention. Thus, adverse influence on the filter characteristics of another filter connected in common can be significantly reduced.

Figure 28:
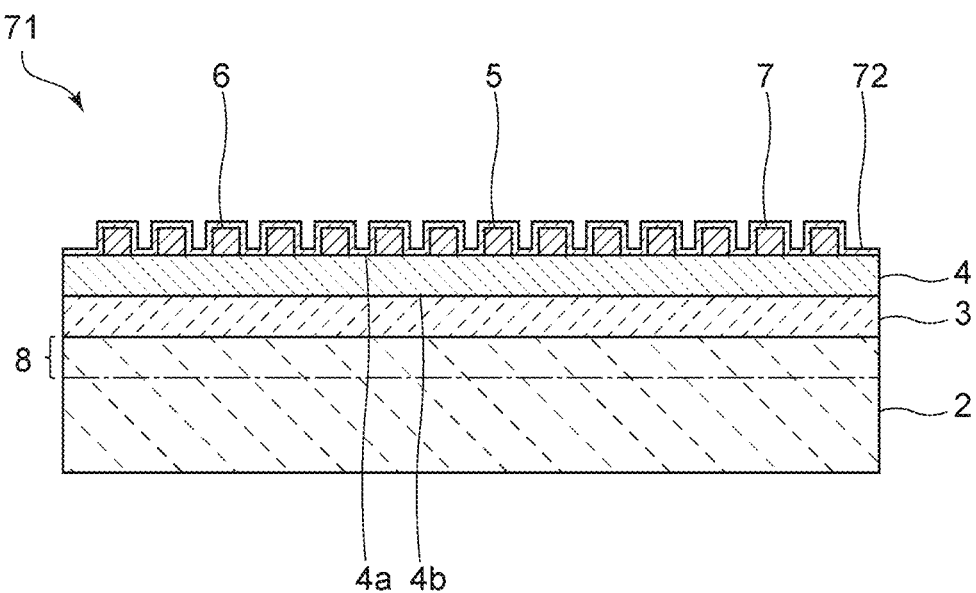
FIG. 28 is a front cross-sectional view that shows a relevant portion of an acoustic wave device that is used in a sixth preferred embodiment of the present invention.

FIG. 28 is a front cross-sectional view that shows a relevant portion of an acoustic wave device that is used in a sixth preferred embodiment of the present invention. In the acoustic wave device 71, a protective film 72 is laminated to cover the interdigital transducer electrode 5 and the reflectors 6, 7. In this way, in an acoustic wave device according to a preferred embodiment of the present invention, the protective film 72 may be laminated to cover the interdigital transducer electrode 5. The acoustic wave device 71 is provided similar to the acoustic wave device 1, except that the protective film 72 is provided.

Examples of the protective film 72 may include one of more of various electrically insulating materials, for example, silicon carbide, silicon nitride, aluminum oxide, and zinc oxide.

Figure 29:
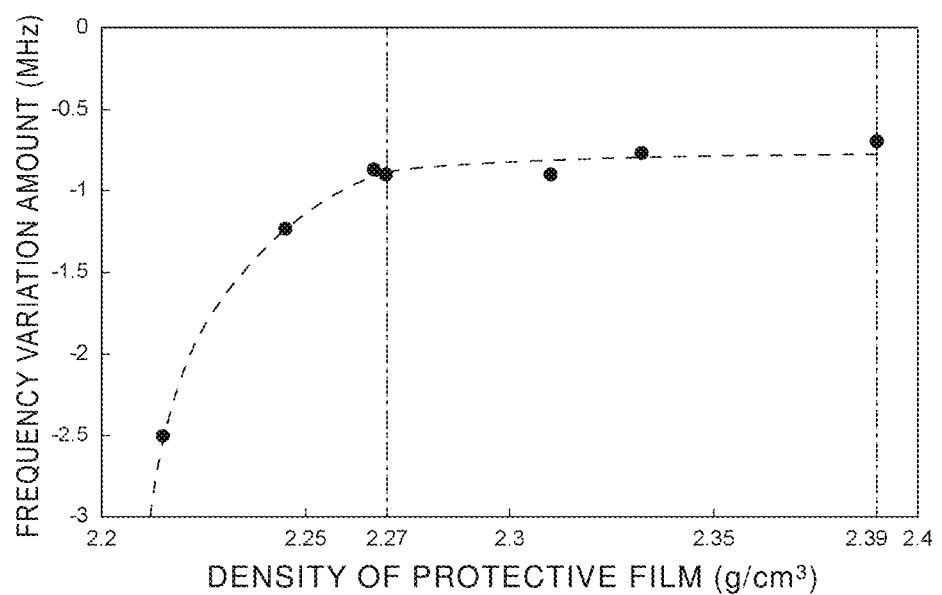
FIG. 29 is a graph that shows the relationship between the density of a protective film and a frequency variation amount.

Incidentally, when the protective film 72 includes silicon oxide, the protective film 72 absorbs moisture in a high humidity environment. For this reason, the acoustic velocity of acoustic waves may decrease as a result of, for example, an increase in the weight of the protective film 72. As a result, in the acoustic wave device 71, the resonant frequency, or the like, may decrease. Preferably, for example, with the protective film 72 including silicon oxide, where the wave length determined by the electrode finger pitch of the interdigital transducer electrode 5 is $\lambda$, the film thickness of the piezoelectric body 4 is preferably less than or equal to about 3.5$\lambda$, and the density of the protective film 72 is greater than or equal to about 2.27 g/cm$^3$. FIG. 29 is a graph that shows the relationship between the density of the protective film 72 and a frequency variation amount. As is apparent from FIG. 29, the density of the protective film 72 is preferably greater than or equal to about 2.27 g/cm$^3$, for example.

The film thickness of the piezoelectric body 4 is preferably less than or equal to about 2.5$\lambda$ and is more preferably less than or equal to about 1.5$\lambda$, for example. Thus, the degree of concentration of energy on the surface of the piezoelectric body 4 can be significantly increased.

Figure 30:
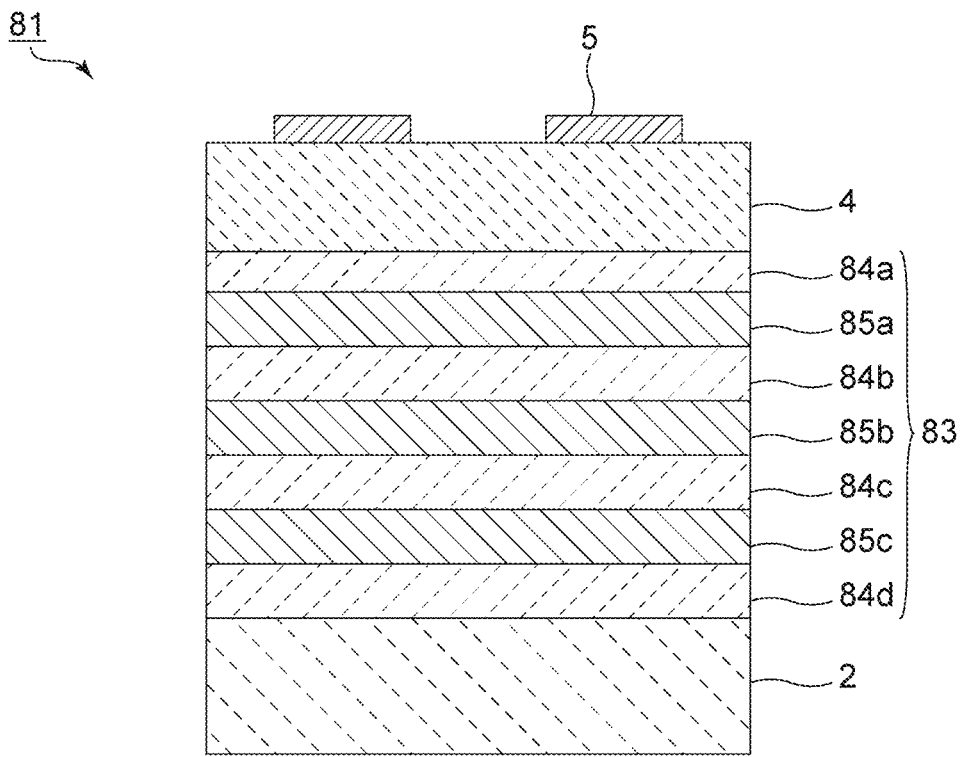
FIG. 30 is a front cross-sectional view of an acoustic wave device that is used in a seventh preferred embodiment of the present invention.

FIG. 30 is a front cross-sectional view showing an acoustic wave device according to a seventh preferred embodiment of the present invention. As shown in FIG. 30, similar to the acoustic wave device 81 according to the preferred embodiments of the present invention, an acoustic reflection layer 83 may be provided between the support substrate 2 and the piezoelectric body 4. The acoustic reflection layer 83 includes low acoustic impedance layers 84*a* to 84*d* having a relatively low acoustic impedance and high acoustic impedance layers 85*a* to 85*d* having a relatively high acoustic impedance. The number of laminated low acoustic impedance layers and the number of laminated high acoustic impedance layers are not specifically limited. Preferably, for example, at least one low acoustic impedance layer and at least one high acoustic impedance layer are laminated.

The acoustic wave device 81 has the above-described structure, so plate waves that propagate in the piezoelectric body 4 may be used. In this case as well, weighting is applied to the interdigital transducer electrode 5 as in the case of the acoustic wave device of the first preferred embodiment. Thus, the fractional band width can be adjusted, and a decrease in quality factor can be significantly reduced.

The acoustic wave device of each of the preferred embodiments of the present invention may be used as a component of a duplexer of a radio-frequency front-end circuit, or the like. An example of such a radio-frequency front-end circuit will be described below.

Figure 31:
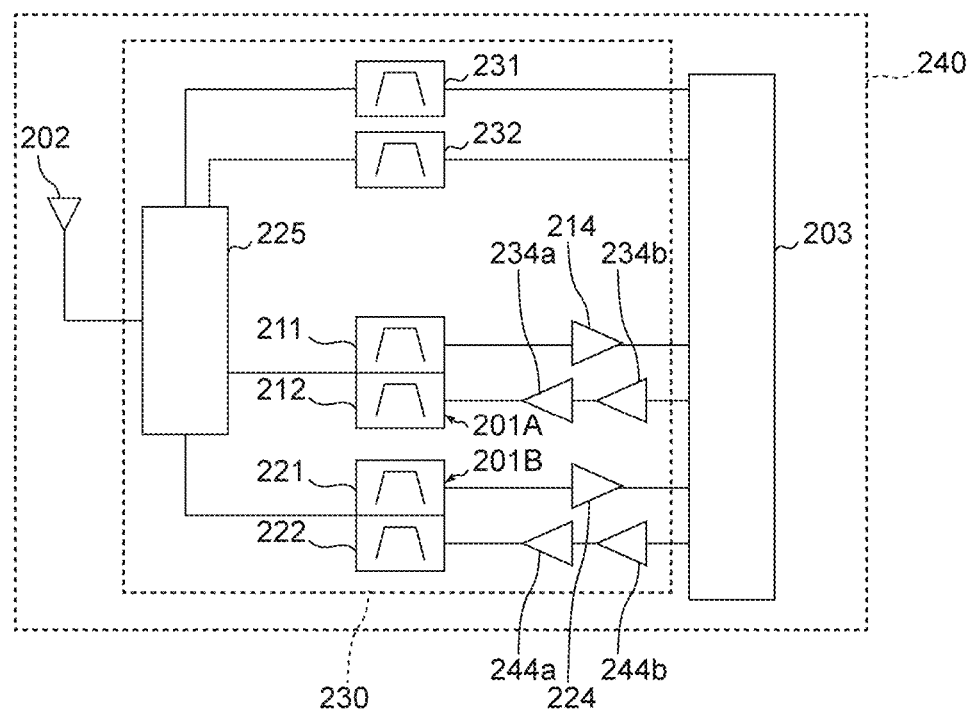
FIG. 31 is a view of a communication device including a radio-frequency front-end circuit.

FIG. 31 is a view of a communication device including a radio-frequency front-end circuit. FIG. 31 also shows some elements connected to the radio-frequency front-end circuit 230, for example, an antenna element 202 and an RF signal processing circuit (RFIC) 203. The radio-frequency front-end circuit 230 and the RF signal processing circuit 203 define the communication device 240. The communication device 240 may include a power supply, a CPU, or a display.

The radio-frequency front-end circuit 230 includes a switch 225, duplexers 201A, 201B, low-noise amplifier circuits 214, 224, filters 231, 232, and power amplifier circuits 234*a*, 234*b*, 244*a*, 244*b*. The radio-frequency front-end circuit 230 and the communication device 240 in FIG. 31 are examples of the radio-frequency front-end circuit and the communication device, and the radio-frequency front-end circuit and the communication device are not limited to these configurations.

The duplexer 201A includes filters 211, 212. The duplexer 201B includes filters 221, 222. The duplexers 201A, 201B are connected to the antenna element 202 via the switch 225. The acoustic wave device may be the duplexer 201A or the duplexer 201B or may be the filter 211, the filter 212, the filter 221, or the filter 222. The acoustic wave device may be an acoustic wave resonator that is a component of the duplexer 201A, the duplexer 201B, the filter 211, the filter 212, the filter 221, or the filter 222. Furthermore, the acoustic wave device may be applied to a configuration including three or more filters, for example, a triplexer including a common antenna terminal for three filters and a hexaplexer including a common antenna terminal for six filters.

In other words, the acoustic wave devices include an acoustic wave resonator, a filter, and a multiplexer including two or more filters. The multiplexer is not limited to a configuration including both a transmission filter and a receiving filter and may have a configuration including only a transmission filter or a receiving filter.

The switch 225 connects the antenna element 202 to a signal path that supports a predetermined band in accordance with a control signal from a control unit (not shown). The switch 225 is, for example, an SPDT (single pole double throw) switch. The signal path to be connected to the antenna element 202 is not limited to one and may be multiple. In other words, the radio-frequency front-end circuit 230 may support carrier aggregation.

The low-noise amplifier circuit 214 is a receiving amplifier circuit that amplifies a radio-frequency signal (here, radio-frequency reception signal) via the antenna element 202, the switch 225, and the duplexer 201A and that outputs the amplified radio-frequency signal to the RF signal processing circuit 203. The low-noise amplifier circuit 224 is a receiving amplifier circuit that amplifies a radio-frequency signal (here, radio-frequency reception signal) via the antenna element 202, the switch 225, and the duplexer 201B and that outputs the amplified radio-frequency signal to the RF signal processing circuit 203.

The power amplifier circuits 234*a*, 234*b* each are a transmission amplifier circuit that amplifies a radio-frequency signal (here, radio-frequency transmission signal) output from the RF signal processing circuit 203 and that outputs the radio-frequency signal to the antenna element 202 via the duplexer 201A and the switch 225. The power amplifier circuits 244*a*, 244*b* each are a transmission amplifier circuit that amplifies a radio-frequency signal (here, radio-frequency transmission signal) output from the RF signal processing circuit 203 and that outputs the radio-frequency signal to the antenna element 202 via the duplexer 201B and the switch 225.

The RF signal processing circuit 203 processes a radio-frequency reception signal input from the antenna element 202 via a reception signal path by down conversion, or the like, and outputs the processed and generated reception signal. The RF signal processing circuit 203 processes an input transmission signal by up conversion, or the like, and outputs the processed and generated radio-frequency transmission signal to the power amplifier circuits 234a, 234b, 244a, 244b. The RF signal processing circuit 203 is preferably, for example, an RFIC. The communication device may include a BB (baseband) IC. In this case, the BBIC processes a reception signal processed by the RFIC. The BBIC processes a transmission signal and outputs the processed transmission signal to the RFIC. A reception signal processed by the BBIC or a transmission signal before being processed by the BBIC is, for example, an image signal, an audio signal, or the like. The radio-frequency front-end circuit 230 may include another circuit element between the above-described components.

The radio-frequency front-end circuit 230 may include duplexers according to a modification of the duplexers 201A, 201B in place of the duplexers 201A, 201B.

On the other hand, the filters 231, 232 in the communication device 240 are connected between the RF signal processing circuit 203 and the switch 225 without intervening the low-noise amplifier circuits 214, 224 or the power amplifier circuits 234a, 234b, 244a, 244b. The filters 231, 232, as well as the duplexers 201A, 201B, are connected to the antenna element 202 via the switch 225.

With the radio-frequency front-end circuit 230 and communication device 240 configured as described above, an acoustic wave resonator, a filter, a duplexer, a multiplexer including three or more filters, or the like, which is an acoustic wave device according to a preferred embodiment of the present invention, is provided, so degradation of the quality factor can be made difficult to occur even when the fractional band width is adjusted.

The acoustic wave devices, radio-frequency front-end circuits, and communication devices according to preferred embodiments of the present invention are described by way of the above-described preferred embodiments. However, the present invention also encompasses other preferred embodiments implemented by combining selected elements of the above-described preferred embodiments, modifications obtained by applying various alterations that are conceived of by persons skilled in the art to the above-described preferred embodiments without departing from the purport of the present invention, and various devices that include the radio-frequency front-end circuit or communication device according to the preferred embodiments of the present invention.

Preferred embodiments of the present invention are widely usable in acoustic wave resonators, filters, duplexers, multiplexers including two or more filters, front-end circuits, and communication appliances, for example, a cellular phone, as a communication device.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a high acoustic velocity material layer;
a piezoelectric body directly or indirectly provided on the high acoustic velocity material layer; and
an interdigital transducer electrode directly or indirectly provided on the piezoelectric body; wherein
an acoustic velocity of bulk waves that propagate in the high acoustic velocity material layer is higher than an acoustic velocity of acoustic waves that propagate in the piezoelectric body;
the interdigital transducer electrode includes a first busbar, a second busbar spaced away from the first busbar, a plurality of first electrode fingers electrically connected to the first busbar, and a plurality of second electrode fingers electrically connected to the second busbar; and
a weighting is applied to the interdigital transducer electrode by providing a floating electrode finger not electrically connected to the first busbar or the second busbar or applied by providing an electrode finger provided by metallizing a gap between the first electrode fingers or a gap between the second electrode fingers to integrate the first electrode fingers or the second electrode fingers.

2. The acoustic wave device according to claim 1, wherein the weighting is applied by providing the floating electrode finger.

3. The acoustic wave device according to claim 1, wherein the acoustic wave device is a series arm resonator of a ladder filter including the series arm resonator and a parallel arm resonator.

4. The acoustic wave device according to claim 1, further comprising:
a low acoustic velocity material layer laminated between the high acoustic velocity material layer and the piezoelectric body; wherein
an acoustic velocity of bulk waves that propagate in the low acoustic velocity material layer is lower than the acoustic velocity of acoustic waves that propagate in the piezoelectric body.

5. The acoustic wave device according to claim 4, further comprising a support substrate provided on a surface of the high acoustic velocity material layer, opposite from a surface of the high acoustic velocity material layer, on which the low acoustic velocity material layer is provided.

6. The acoustic wave device according to claim 1, wherein the high acoustic velocity material layer is a support substrate.

7. A filter comprising a filter device including a plurality of acoustic wave resonators at least one of which is the acoustic wave device according to claim 1.

8. The filter according to claim 7, wherein
the plurality of acoustic wave resonators include a series arm resonator and a parallel arm resonator; and
a ladder filter includes the plurality of acoustic wave resonators.

9. A filter comprising:
a filter device that includes a plurality of acoustic wave resonators including a series arm resonator and a parallel arm resonator; and
a ladder filter including the plurality of acoustic wave resonators; wherein
the series arm resonator is the acoustic wave device according to claim 1.

10. A ladder filter comprising:
a plurality of series arm resonators provided in a series arm connecting a first terminal and a second terminal; and
a parallel arm resonator provided in a parallel arm connecting the series arm and a ground potential; wherein
one of the series arm resonators and the parallel arm resonator, closest to the first terminal connected to an antenna terminal, is the series arm resonator; and at least one of the series arm resonators and the parallel arm resonator, other than the series arm resonator closest to the antenna terminal, is the acoustic wave device according to claim 1.

11. A ladder filter comprising:

a plurality of series arm resonators provided in a series arm connecting a first terminal and a second terminal; and a parallel arm resonator provided in a parallel arm connecting the series arm and a ground potential; wherein one of the series arm resonators and the parallel arm resonator, closest to the first terminal connected to an antenna terminal, is the parallel arm resonator; and at least one of the series arm resonators and the parallel arm resonator, other than the series arm resonator closest to the first terminal or the parallel arm resonator closest to the antenna terminal, is the acoustic wave device according to claim 1.

12. A filter device comprising:

a longitudinally coupled resonator acoustic wave filter; wherein the longitudinally coupled resonator acoustic wave filter is the acoustic wave device according to claim 1.

13. The filter according to claim 12, wherein the filter device further includes a ladder filter connected to the longitudinally coupled resonator acoustic wave filter.

14. A filter comprising:

a first terminal connected to an antenna, and a second terminal; and a longitudinally coupled resonator acoustic wave filter and at least one acoustic wave resonator, connected between the first terminal and the second terminal; wherein at least one of the longitudinally coupled resonator acoustic wave filter and the at least one acoustic wave resonator, other than one of the longitudinally coupled resonator acoustic wave filter and the at least one acoustic wave resonator, closest to the first terminal, is the acoustic wave device according to claim 1.

15. A multiplexer comprising:

an antenna terminal connected to an antenna; and a plurality of band pass filters including one ends connected in common to the antenna terminal; wherein at least one of the plurality of band pass filters includes a plurality of acoustic wave resonators; and at least one of the plurality of acoustic wave resonators is the acoustic wave device according to claim 1.

16. A radio-frequency front-end circuit comprising:

the acoustic wave device according to claim 1; and a power amplifier.

17. A communication device comprising:

the radio-frequency front-end circuit according to claim 16; and an RF signal processing circuit.

18. The acoustic wave device according to claim 1, wherein a percentage of weighting is between about 5% and about 20%; and the percentage of weighting W % is defined by the equation $$W\% = A/(B_1 + B_2 - 2*A)$$

where A is a total number of the floating electrode fingers, $B_1$ is a total number of the first electrode fingers, and $B_2$ is a total number of the second electrode fingers.

* * * * *